United States Patent [19]
Meisberger et al.

[11] Patent Number: 5,578,821
[45] Date of Patent: Nov. 26, 1996

[54] ELECTRON BEAM INSPECTION SYSTEM AND METHOD

[75] Inventors: Dan Meisberger, San Jose; Alan D. Brodie, Palo Alto; Anil A. Desai; Dennis G. Emge, both of San Jose; Zhong-Wei Chen, Palo Alto; Richard Simmons, Los Altos; Dave E. A. Smith, San Mateo; April Dutta, Milpitas; J. Kirkwood H. Rough, San Jose; Leslie A. Honfi, Sunnyvale; Henry Pearce-Percy, Los Gatos; John McMurtry, Menlo Park, all of Calif.; Eric Munro, London, England

[73] Assignee: KLA Instruments Corporation, San Jose, Calif.

[21] Appl. No.: 371,458

[22] Filed: Jan. 11, 1995

Related U.S. Application Data

[63] Continuation of Ser. No. 889,460, May 27, 1992, abandoned.

[51] Int. Cl.$^6$ ...................................................... H01J 37/00
[52] U.S. Cl. ...................... 250/310; 250/311; 250/396 R; 250/396 ML; 250/397
[58] Field of Search .................................... 250/310, 311, 250/346 R, 396 ML, 392, 398, 440.11, 441.11, 442.11

[56] References Cited

U.S. PATENT DOCUMENTS

| | | | |
|---|---|---|---|
| 3,845,305 | 10/1974 | Liebe | 250/398 |
| 4,101,771 | 7/1978 | Hofer et al. | 250/397 |
| 4,247,203 | 1/1981 | Levy et al. | 356/398 |
| 4,438,332 | 5/1984 | Lichtenegger | 250/310 |
| 4,503,329 | 3/1985 | Yamaguchi et al. | 250/309 |
| 4,508,968 | 4/1985 | Kobayashi et al. | 250/441.1 |
| 4,609,809 | 9/1986 | Yamaguchi et al. | 219/121 EM |
| 4,618,938 | 10/1986 | Sandland et al. | 364/552 |

(List continued on next page.)

OTHER PUBLICATIONS

Herriott et al., EBES: A Practical Electron Lithography System, *IEEE Transactions on Electron Devices*, vol. ED-22, No. 6, Jul. 1975, pp. 385–391.
Koshishiba et al., Pattern Inspection of X-Ray Mask Mising Scanning Transmission Electron Microscope, *Japan Journal of Applied Physics*, Issue 12, 1989, pp. 1765–1774.

(List continued on next page.)

*Primary Examiner*—Jack I. Berman
*Assistant Examiner*—Kiet T. Nguyen
*Attorney, Agent, or Firm*—Allston L. Jones

[57] ABSTRACT

A method and apparatus for a charged particle scanning system and an automatic inspection system, including wafers and masks used in microcircuit fabrication. A charged particle beam is directed at the surface of a substrate for scanning that substrate and a selection of detectors are included to detect at least one of the secondary charged particles, back-scattered charged particles and transmitted charged particles from the substrate. The substrate is mounted on an x-y stage to provide at least one degree of freedom while the substrate is being scanned by the charged particle beam. The substrate is also subjected to an electric field on it's surface to accelerate the secondary charged particles. The system facilitates inspection at low beam energies on charge sensitive insulating substrates and has the capability to accurately measure the position of the substrate with respect to the charged particle beam. Additionally, there is an optical alignment system for initially aligning the substrate beneath the charged particle beam. To function most efficiently there is also a vacuum system for evacuating and repressurizing a chamber containing the substrate. The vacuum system can be used to hold one substrate at vacuum while a second one is being loaded/unloaded, evacuated or repressurized. Alternately, the vacuum system can simultaneously evacuate a plurality of substrates prior to inspection and repressurize the same plurality of substrates following inspection. In the inspection configuration, there is also a comparison system for comparing the pattern on the substrate with a second pattern.

51 Claims, 14 Drawing Sheets

U.S. PATENT DOCUMENTS

| | | | |
|---|---|---|---|
| 4,644,172 | 2/1987 | Sandland et al. | 250/548 |
| 4,658,136 | 4/1987 | Ohtaka et al. | 250/310 |
| 4,658,138 | 4/1987 | Koike et al. | 250/310 |
| 4,665,315 | 5/1987 | Bacchetti et al. | 250/492.1 |
| 4,714,833 | 12/1987 | Rose et al. | 250/397 |
| 4,769,543 | 9/1988 | Plies | 250/310 |
| 4,795,809 | 3/1974 | Takashima | 250/311 |
| 4,805,123 | 2/1989 | Specht et al. | 364/559 |
| 4,812,651 | 3/1989 | Feuerbaum et al. | 250/310 |
| 4,814,615 | 3/1989 | Fushimi et al. | 250/311 |
| 4,831,266 | 5/1989 | Frosien et al. | 250/347 |
| 4,845,558 | 7/1989 | Tsai et al. | 358/106 |
| 4,868,395 | 9/1989 | Kasahara et al. | 250/398 |
| 4,871,911 | 11/1989 | Van Gorkom et al. | 250/310 |
| 4,896,036 | 1/1990 | Rose et al. | 250/310 |
| 4,924,104 | 5/1990 | Stengl et al. | 250/492.3 |
| 4,926,489 | 5/1990 | Danielson et al. | 382/8 |
| 4,933,565 | 6/1990 | Yamaguchi et al. | 250/492.2 |
| 4,939,364 | 7/1990 | Ishitani et al. | 250/309 |
| 5,117,111 | 5/1992 | Nakamura et al. | 250/310 |
| 5,118,941 | 6/1992 | Larson | 250/310 |
| 5,142,148 | 8/1992 | Sato | 250/310 |
| 5,254,857 | 10/1993 | Ross et al. | 250/310 |

OTHER PUBLICATIONS

Kato et al., Sub–Micron Pattern Inspection System Using Elctron Beam, *SPIE*, vol. 632 Electron–Beam, X–Ray, Ion–Beam Techniques for Submicrometer Lithographies V (1986), pp. 203–209.

Takeuchi et al., Electron–Beam Inspection Technology for X–Ray Masks, *F. Vac. Sci. Technol. B*, vol. 6, No. 1, Jan/Feb 1988.

Goto et al., In–Lens Deflection System with Nonequisectored–Typed Multipole Electrostatic, *J. Vac. Sci. Technol.*, B1 (4), Oct.–Dec. 1983, pp. 1289–1292.

Idesawa et al., Numerical Considerations on Multiple–Type Electrostatic Deflectors, *J. Vac. Sci. Technol.*, B1 (4), Oct.–Dec. 1983, pp. 1322–1326.

W. H. J. Andersen, Optimum Adjustment and Correction of the Wien Filter, *Brit. J. Appl. Phys.*, 1967, vol. 18. Printed in Great Britain, pp. 1573–1579.

G. H. Curtis, et al., A Wien Filter for Use as an Energy Analyzer with an Electron Microscope, *The Review of Scientific Instruments*, vol. 42, No. 5, May 1971, pp. 630–637.

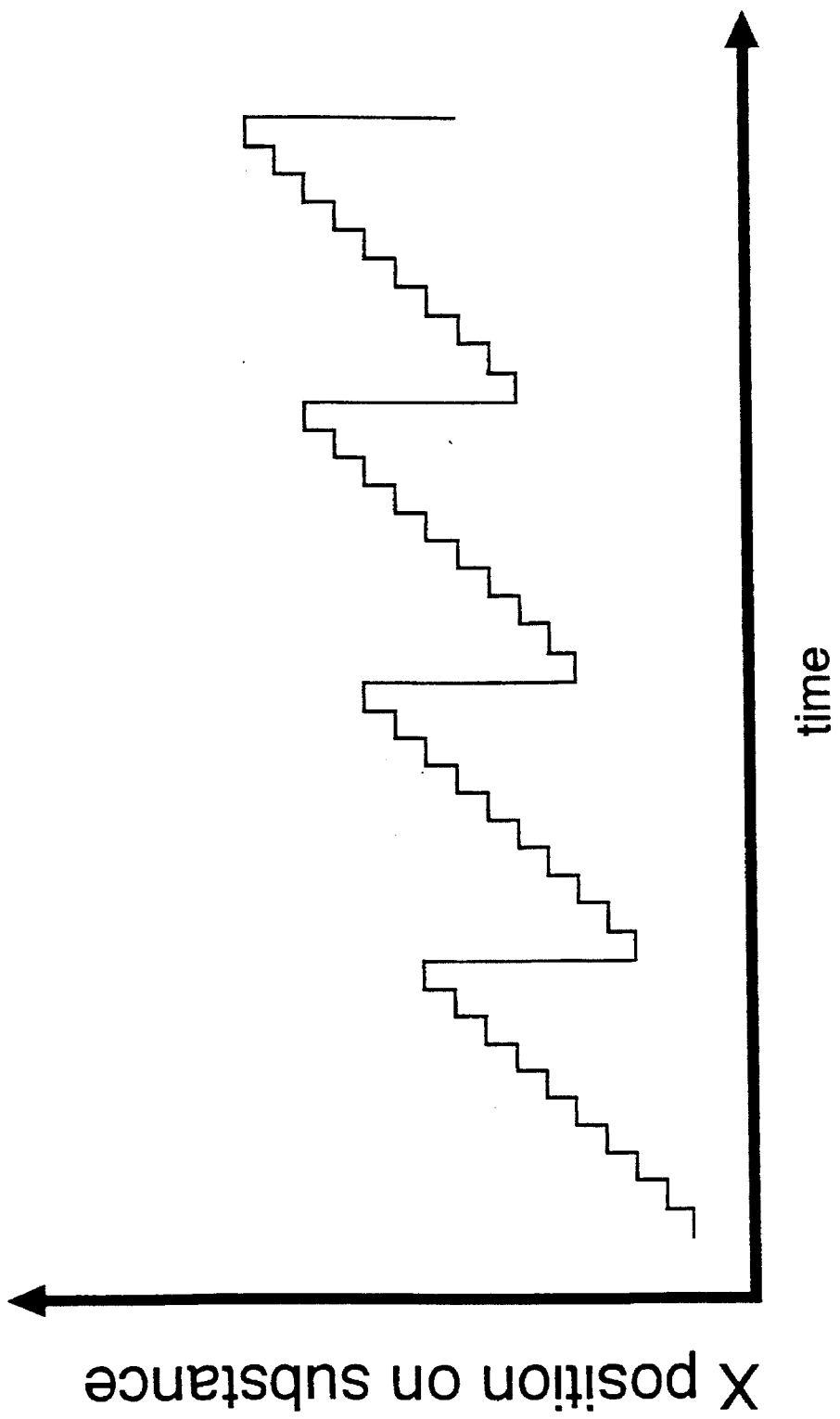

ELECTRON BEAM INSPECTION SYSTEM AND METHOD

CROSS REFERENCE

This is a continuation of application of Ser. No. 07/889,460, filed on May 27, 1992, now abandoned.

This application is related to another application that is assigned to the same assignee entitled "ELECTRON BEAM INSPECTION SYSTEM AND METHOD" filed on May 30, 1991, and having Ser. No. 07/710,351.

FIELD OF THE INVENTION

This invention relates to the automatic inspection of substrates of various descriptions used in the making of micro-circuits and particularly the inspection of optical masks, X-Ray masks and semiconductor wafers.

BACKGROUND OF THE INVENTION

A prerequisite of micro-circuit production with a reasonable yield is defect free masks and wafers to be used in the production process. Over the past 12 years a number of systems have been developed, and patented for the automatic inspection of optical masks and wafers. (See U.S. Pat. No. 4,247,203, 4,805,123, 4,618,938 and 4,845,558). These systems perform a comparison between two adjacent dice on a photomask, reticle or wafer. Similarly, technology has evolved to inspect a die against a CAD database. (See U.S. Pat. No. 4,926,489) These optical systems are, however, limited to optical masks because defects on X-Ray masks may not be apparent in the visible or ultraviolet spectrum. Furthermore, optical inspection is limited in its resolution capability by the fundamental diffraction limit that of course also limits optical lithography. Even with phase shift mask techniques it is expected that line widths below 0.35 microns cannot be achieved with optical lithography techniques and that X-Ray lithography will dominate for line widths smaller than that.

For the inspection of X-Ray masks and very dense wafer patterns, it is expected that scanning electron microscopy techniques will be employed. Recently companies have experimented with using conventional electron microscopes for the inspection of X-Ray masks and wafers. While these experiments have been successful in detecting defects, conventional electron microscopes are much too slow and require highly skilled operators. These two attributes make such systems not practical for use in the semiconductor industry.

The present invention also uses an in-situ plasma cleaning system that avoids sputtering. A system that does not have provision to avoid sputtering was previously disclosed for electron beam writing systems in U.S. Pat. No. 4,665,315, Method and Apparatus for In-Situ Plasma Cleaning of Electron Beam Optical System, by Lawrence F. Bacchetti, et al.

SUMMARY OF THE INVENTION

In accordance with the preferred embodiments of the present invention there is disclosed a method and apparatus for a charged particle scanning system and an automatic inspection system. In one embodiment there is an automatic system and method for the automatic inspection of a substrate that includes a charged particle beam column for delivering and scanning a charged particle beam on the surface of the substrate, a detector means for detecting at least one of the three types of charged particles emanating from the top or bottom surfaces of the substrate (namely, secondary charged particles, back-scattered charged particles and transmitted charged particles), and means for moving the charged particle beam with respect to surface of the substrate.

In a second embodiment there is an electron bean inspection system that includes an insitu, plasma based, organic contamination oxidizer, an RF generator for excitation of a plasma, and automatic plasma adjustment means for adjusting the pressure in selected regions of the system to form the plasma.

BRIEF DESCRIPTION OF THE DRAWINGS

FIG. 3d is a graphical representation of the X-coordinate of the beam on the substrate as a function of time during the scan depicted in FIG. 3b.

DESCRIPTION OF THE PREFERRED EMBODIMENT SYSTEM OVERVIEW

Figure 1:
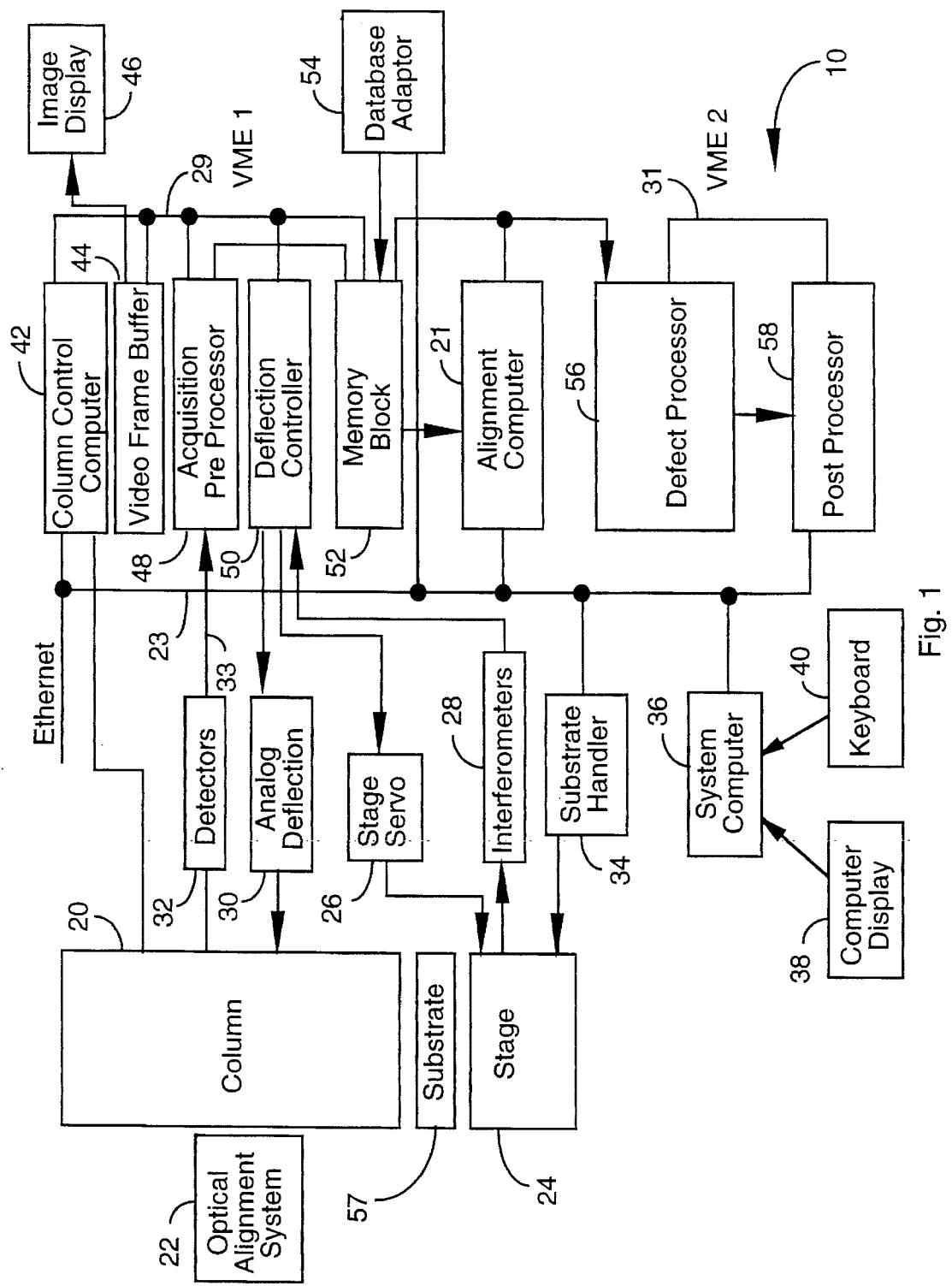
FIG. 1 is an over-all block diagram of the system of the present invention.

The present invention provides an economically viable, automatic charged particle beam inspection system and method for the inspection of wafers, X-ray masks and similar substrates in a production environment. While it is expected that the predominant use of the present invention will be for the inspection of wafers, optical masks, X-ray masks, electron-beam-proximity masks and stencil masks, the techniques disclosed here are applicable to the high speed electron beam imaging of any material, and furthermore are useful for electron beam writing to expose photoresist material in the manufacture of masks or wafers.

There are two basic modes of operation, depending upon whether the substrate is insulating or conducting. A "high voltage mode" is primarily intended for the inspection of conducting or conductivily coated X-ray masks, E-beam proximity stencil masks or wafer prints. In this mode, a high voltage scanning beam can be used because the surface cannot charge. A "low voltage mode" is primarily intended for the inspection of in-process wafers that include layers of non-conducting materials and of optical masks. In this mode, the use of a lower voltage scanning beam minimizes both charging and damage effects. Except for these differences, both modes use similar high speed strategies for finding and classifying defects.

The requirement of economic viability excludes present scanning electron microscopes because these devices have scanning speeds that are too slow and also require operator skills that exceed the skills of much of the available work force.

A novel feature of the present invention is its ability to not only detect various types of defects but to differentiate between them. By virtue of the present invention being able to simultaneously detect and differentiate between backscattered, transmitted and secondary electrons in "high voltage mode", defects can be classified readily. As an example, a defect detected by only the transmission detector on an X-ray mask is probably a void in the absorptive material. A defect detected by the secondary electron detector but not by the back-scattered electron detector is most likely an organic particle, and a defect detected by the back-scatter electron detector is very likely a contaminant of a high atomic weight. Because some types of defects, such as organic contaminants on X-ray masks, do not print on the wafer, the ability to differentiate between various types of defects is a significant advantage of the present invention. The present invention therefore permits not only the detection of defects but the ability to classify them.

The system also employs a number of techniques to make it suitable for semiconductor manufacturing operations. To avoid contaminants being stirred up, the pump down and repressurization speeds are limited and the gas flow is kept laminar. In order to save time, these operations are done concurrently with the scanning of another sample. To further reduce unproductive time, six field emission sources are mounted on a turret. Finally, all the major adjustments of the electron beam, usually handled by an operator, are done by a computer, thereby permitting the use of the system by someone of relatively low skill level.

In FIG. 1 there is an overall block diagram of an inspection system 10 of the present invention. In system 10 an automatic inspection apparatus of X-ray masks, wafers, and other substrates, is shown which uses a scanning electron microscope as its sensor.

The inspection system has two modes of operation: die-to-die and die-to-database. In both modes, defects are detected by comparing an electron beam image derived from scanning the substrate against a standard. In die-to-die inspection, signals from two dice of the same substrate are compared with each other, while in die-to-database inspection the signal from one die derived from the electron microscope is compared with a signal that is derived from the database which typically is the one that was used to make the die.

Substrate 57 to be inspected is held in a holder which is automatically placed beneath electron beam column 20 on x-y stage 24 by substrate handler 34. This is accomplished by commanding substrate handler 34 by system computer 36 to remove the substrate 57 of interest from a cassette with the flat 59 or notch (see FIGS. 2 and 3a) on substrate 57 being detected automatically to properly orient the substrate 57 in handler 34. The substrate is then loaded under column 20. Next, the operator visually observes the mask through optical alignment system 22 to locate the alignment points on the substrate (these may be any operator selected features on the substrate) to ensure that the x-directional motion of the stage is substantially parallel to the x-axis of the care area of the substrate patterns, i.e., the area of interest for the inspection. That completes the coarse alignment.

Fine alignment is subsequently achieved by the operator scanning the substrate with the electron beam and observing the image on image display 46. All alignment data is then stored in alignment computer 21 which works in cooperation with system computer 36 for calculation of the actual combined x and y motions necessary to scan the die along its x and y axes so that no further operator alignment action is required for inspections of the same type of substrates. Once the substrate is properly aligned, the inspection process is initiated.

Column 20 and its optical alignment system 22, analog deflection circuit 30 and detectors 32 (as described more completely below) then direct an electron beam at substrate surface 57 and detect the secondary electrons, the back-scattered electrons and those which pass through substrate 57. That operation and the data collection from that exposure is performed by column control computer 42, video frame buffer 44, acquisition pre-processor 48, deflection controller 50, memory block 52. VME bus, VME1, 29, serves as the communication link between the subsystems.

The position and movement of stage 24 during the inspection of substrate 57 is controlled by stage servo 26 and interferometers 28 under the control of deflection controller 50 and alignment computer 21.

When the comparison mode is die-to-database, database adaptor 54 in communication with memory block 52 is used as a source of the signal that is equivalent to the expected die format.

The actual defect processing is performed on the data in memory block 52 by defect processor 56 in conjunction with post processor 58, with the communication between these blocks being via bus VME2, 31.

The overall operation of the system is performed by system computer 36, user keyboard 40 and computer display 38 in communication with the other blocks via a data bus 23 which may be similar to an Ethernet bus. (Ethernet is a trademark of Xerox Corp.)

Figure 2:
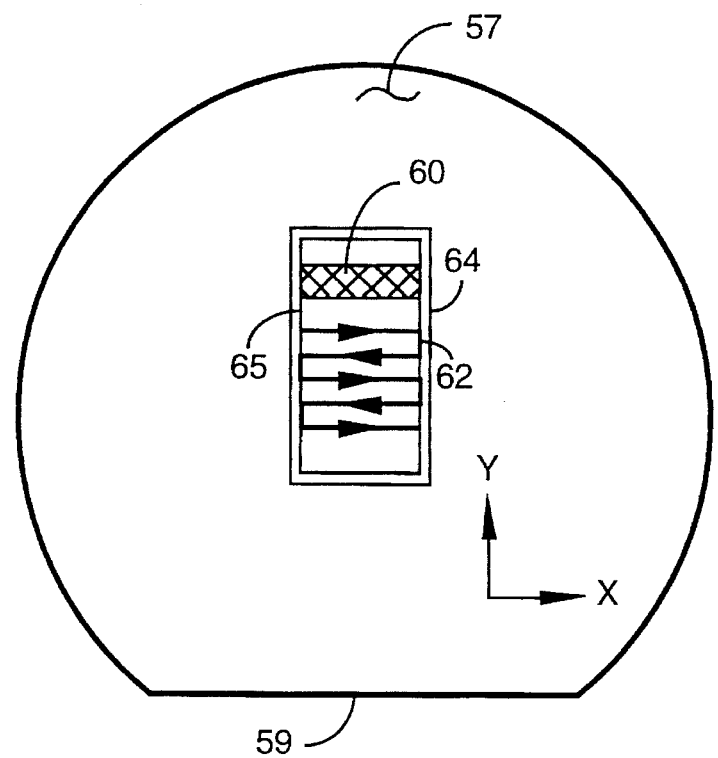
FIG. 2 is a graphical representation of the scan pattern used by the present invention for die-to-database inspection.

Next, FIG. 2 illustrates the scan pattern of the present invention for the inspection in the die-to-database mode. Here a single die 64 is shown on substrate 57. Within die 64 there is a care area 65, or area of significance, that is to be inspected. This area is the area where the critical information is recorded on substrate 57. During the inspection of die 64 the effective scanning motion in the x-direction is provided by moving stage 24 and the effective motion in the y-direction is provided by deflection of the electron beam within each swath which is as wide as the illustrative swath 60. When the inspection swath reaches the right side of die 64, stage 24 is moved in the y direction less than a full swath width. Since the x-y coordinate system of substrate 57 may not be aligned exactly with the x-y coordinates of stage 24 and column 20, the actual movement of stage 24 and the deflection of the beam of column 20 will each have an x and y component during the scanning of a die 64.

To fully inspect the care area 65, the inspection is performed in a back and forth pattern 62 with each of the passes illustrated by pattern 62 being a swath that slightly overlaps the adjacent swath with the swath having a width of that of illustrative swath 60.

In the die-to-database mode the signal corresponding to each swath is compared with the simulated signal derived from database adaptor 54 for a corresponding swath of a perfect die. This procedure is repeated for each of the swaths in care area 65 being inspected before the next die is inspected.

Figure 3A:
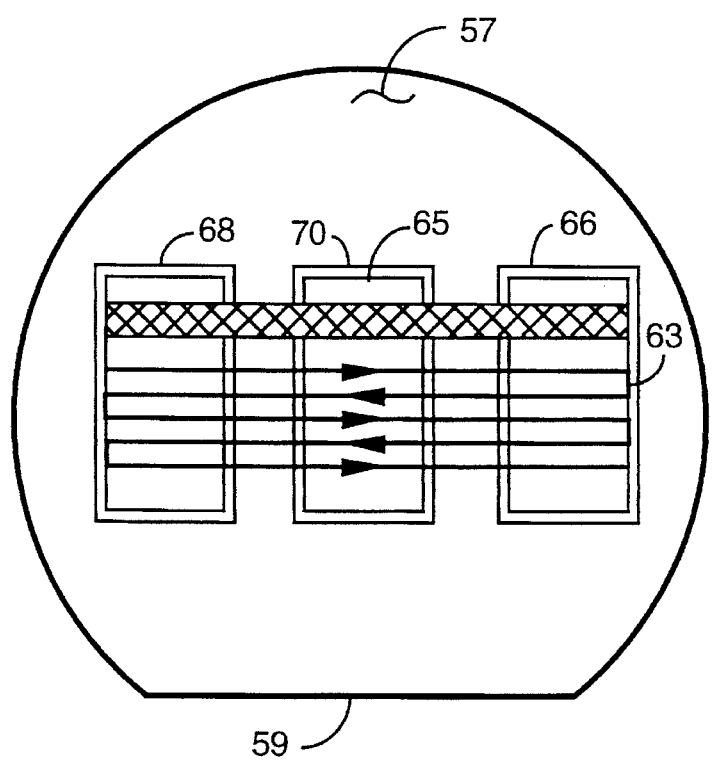
FIG. 3a is a graphical representation of the scan pattern used by the present invention for die-to-die inspection.

FIG. 3a illustrates the scan pattern for die-to-die inspection, and for purposes of illustration, substrate 57 is shown with dies 68, 70 and 66, in that order from left to right. In this inspection mode, similar to that shown in FIG. 2, a back and forth scan pattern 63 is used. However since the inspection mode here is die-to-die, stage 24 is not advanced in the y direction until all three of the dice (as per this illustration) are traversed in the x direction along each of the swaths.

In this mode of comparison, the data of the first pass of die 68 is stored in memory block 52 for comparison with the data from the first pass of die 70 as it is made. At the same time that the comparison between dice 68 and 70 is being made, the data from die 70 is stored in memory block 52 for comparison with the data from the first pass of die 66. Then on the second, or return, pass the order is reversed with the data from the second pass of die 66 being stored for comparison with the data from die 70, which is then stored for comparison with the second pass of die 68. This pattern of inspection and comparison is then repeated as many times as necessary to inspect all of the care areas of substrate 57.

Sometimes it is necessary to obtain images using a multiple scan integration technique, where each pixel is exposed for a longer time interval. Conventional scanning microscopes usually use slow scan techniques that extend the dwell time before the beam moves to an adjacent pixel. In this system, substrate heating and charging considerations make it undesirable to reduce the rate at which pixels are recorded.

Sometimes it is necessary to integrate multiple scans to obtain images with sufficient contrast or to improve the image signal-to-noise ratio. The signal-to-noise ratio is improved by averaging, for each pixel, the signal values from a number of scans of the same position on the substrate. The image contrast in "low voltage mode," which will be described in detail in the ELECTRON OPTICS section of this system overview, can also be improved by scanning the substrate nearby between the times that the electron beam revisits the site of a particular pixel on the substrate. The contrast improvement in low voltage inspection of nonconductive substrates, as shall be explained in the ELECTRON OPTICS section, is accomplished by permitting secondary electrons, generated when nearby regions are scanned, to replace electrons at the particular pixel site between times the beam revisits. In addition, for some temperature-sensitive substrate materials, it is desirable to have a time interval between beam scans of a pixel site in order to permit the heat deposited by the beam to dissipate.

Figure 3B:
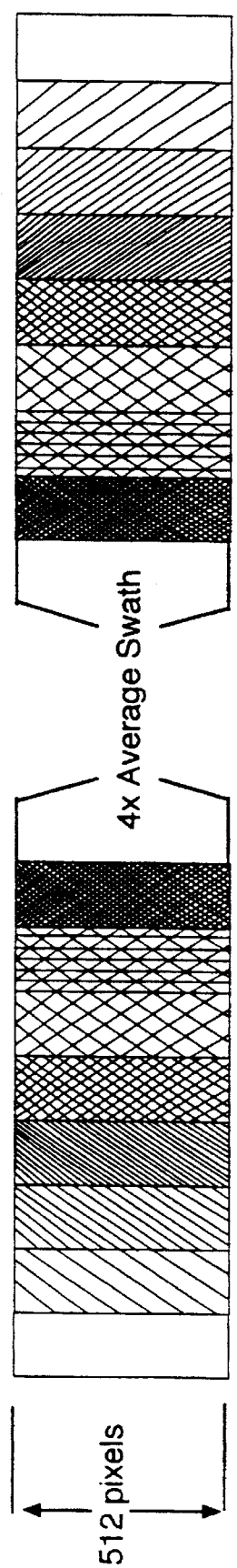
FIG. 3b is a graphical representation of the multiple frame scan integration technique of the present invention used to acquire images that are averaged over several scan fields.

FIG. 3b is a graphical representation of an example of the scanning method employed by the present invention. The figure shows how a region is scanned four times for signal averaging by deflection of the beam to cover a series of 512-by-m pixel rectangles. The center of each successive rectangle is shifted by m/2 pixels along the direction of stage motion.

FIG. 3b shows an example of the overlapping frame scan technique employed in the present invention for signal averaging, contrast improvement, and heat dissipation. In the example shown, each pixel is scanned four times. Each scan line is 512 pixels long in the Y-direction. For overlapping frame scans, a series of m side-by-side lines, numbered 1 to m is scanned on the substrate. The X-direction spacing between lines is set equal to the pixel size and the lines have successively larger X coordinates.

Figure 3C:
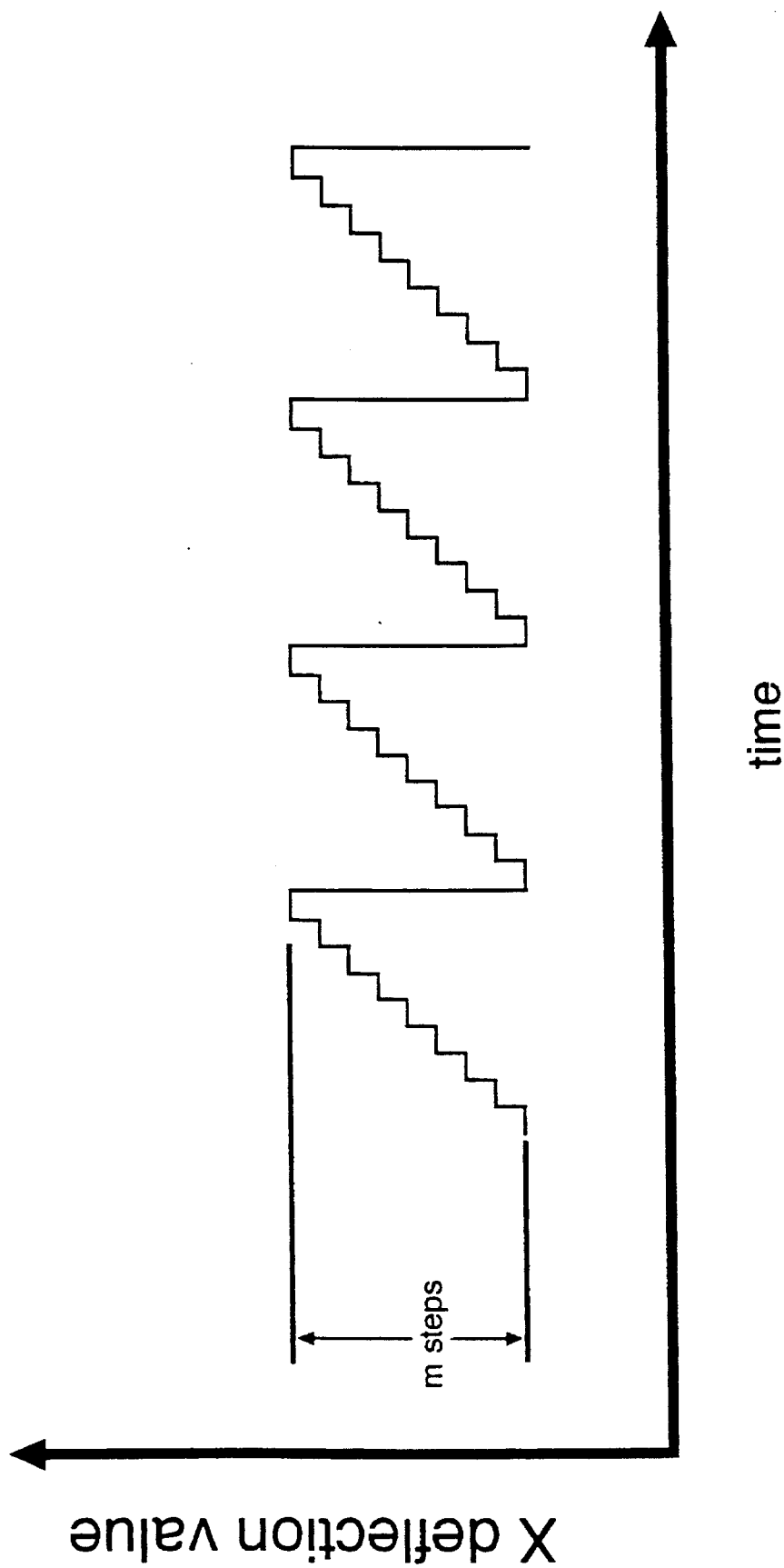
FIG. 3c is a graphical representation of the nominal X-deflection value for the beam as a function of time during the scan depicted in FIG. 3b.

FIG. 3c is a graphical representation of the nominal X-deflection value for the beam as a function of time during the scan depicted in FIG. 3b. The horizontal direction is the time axis, the vertical direction is the X position.

FIG. 3c shows the staircase-like output of the X deflection system used to deflect the beam. After m lines have been scanned, the scan is retraced in the X direction, as shown in FIG. 3c. The X velocity of the stage carrying the substrate under the deflection system is adjusted so that when the beam retraces in the X direction, the position of next scan line coincides with line number (m/4+1) of the first m lines. In the example of four rescans for this description, the stage moves the substrate in the X-direction a distance of m pixel widths in the same time that the beam scans four successive 512-by-m rectangles.

FIG. 3d is a graphical representation of the X-coordinate of the beam on the substrate as a function of time during the scan depicted in FIG. 3b. The horizontal direction is the time axis, the vertical direction is the X position of the beam.

FIG. 3d shows the X-coordinate of each successive scan line on the substrate as a function of time. What is shown is that the combination of the stage moving the substrate under the deflection system and the deflection system moving the scan lines in back and forth in the X direction in the deflection field results in the beam scanning the position of each line on the substrate four times. By recording image data in memory block 52 and averaging from appropriate memory addresses, averaged data can be presented to the defect processor 56 and to alignment computer 21. Although we have used four as an example of the number of averages in this description, the number of scans combined in practice and the number of lines-per-frame m are chosen to produce the best combination of noise reduction, contrast enhancement, and inspection throughput.

The y direction scan (perpendicular to stage motion) is the same as that used for single pass imaging. Here the scan advances one pixel D per exposure interval t. For single pass imaging, using a 512 pixel wide swath, the stage velocity D/512t is chosen so that the stage also advances one pixel during each scan. During multipass imaging, the scanning beam as seen from the substrate must also advance at this rate of D/512t microns/sec in order to record square pixels. To record images with n pixel exposures per pass, the stage advances more slowly at a rate of less than D/512nt, and a stepwise scan in the direction of stage motion is applied, so as to advance the beam an additional $(1-1/n)$ D microns during scan time 512t. After a variable number m steps, the x scan is retraced. Thus the scan trajectory is a $512\times(1-1/n)m$ rectangular frame. When viewed from the substrate surface, one sees the overlapping frame pattern shown in FIG. 3b. The time interval between multiple exposures of each image pixel is 512mt. So long as m is chosen greater than n, one can independently vary both the number and repetition rate of pixel rescans. By recording image data in memory block 52, and averaging data from appropriate addresses, the averaged data can be presented to the defect processor 56 as though it had been recorded in a single, slower pass. The advantage of this technique is the parameters can be adjusted so that the substrate has an optimum time to reach equilibrium between pixel exposures.

In more detail then, referring again to FIG. 3a, using the die-to-die mode for illustration, as the electron beam scans a swath of dice 68 and 70, signals 33 from the three types of detectors are transmitted to acquisition pre-processor 48 where they are converted to digital signals for storage in memory block 52. Data from dice 68 and 70 are simultaneously transmitted to defect processor 56 where any significant discrepancy between the two data streams is then designated as a defect. The accumulation of the defect data from the defect processor 56 is then transferred and consolidated in post-processor 58. It is the post-processor that determines the size and various characteristics of the defects and makes that information available to system computer 36 via bus 23.

In the die-to-database inspection mode, system 10 operates similarly except that memory block 52 receives data from only one die and the reference data for comparison in defect processor 56 is provided by database adaptor 54.

After the entire substrate has been inspected, a list of defects, together with their locations, is displayed on computer display 38, and the operator can then initiate a defect review via keyboard 40. In response to this command, system 10 locates and scans the neighborhood of each defect and displays the image to the operator on image display 46.

SCANNING OPTICS

The much greater, by a factor of almost 100 higher, imaging speed is achieved through the combination of some key elements and the special design of column 20. The first and foremost prerequisite in achieving a higher imaging speed is a much higher beam current, since signal to noise considerations are one of the fundamental limitations in the speed of scanning. In the present invention, a high brightness thermal field emission source is used to produce a very high angular beam intensity and a very high resultant beam current. However, a high electron density results in mutual coulomb repulsion. To combat this, a high electric field is introduced in the vicinity of the cathode, and the beam diameter is also quickly enlarged. In the column there are also no electron cross-overs which would increase the charge density in that area and a large numerical aperture is employed, to again minimize coulomb repulsion problems.

A requirement for scanning the mask at a high rate such as 100 Megapixels per second, is for the detector to be able to temporally separate the secondary (return) electrons originating from two successively scanned pixels. This implies the need for a very short spread in arrival time in comparison with the dwell time on each pixel. To minimize the time of arrival spread from each pixel, the electrons are accelerated soon after leaving the target. The resultant arrival time spread at the detector is consequently held to about 1 nanosecond. To further minimize the arrival time spread, reverse biased high frequency Shottky barrier detectors, one for each type of electron to be detected, are employed (Shottky detectors are included here for illustrative purposes; however, there are other types of semiconductor detectors that could also be used).

ELECTRON OPTICS

The electron optical subsystem is functionally similar to a scanning electron microscope. It provides the scanned electron beam probe and secondary, transmission and back-scattered electron detection elements necessary to form images of the substrate surface. During inspection, the electron beam is scanned in one direction while the stage is moved in the perpendicular direction. Either low voltage secondary electrons, or high energy transmitted electrons or back-scattered electrons are used to form a video signal that is digitized and stored in the form of long, narrow swath images. As well as being unique in its application for automated defect detection at high resolution, the novelty of this optics system lies in the combination of new and prior art technology used to obtain high speed, low noise images at the resolution necessary for inspection.

The beam is typically scanned over a field of 512 pixels (18–100 micrometer width) using a very fast 5 microseconds period sawtooth scan. The deflection is largely free of distortion and is substantially perpendicular to the surface, so that the imaging characteristics are uniform over the scan field.

Detection is highly efficient so that nearly all of the secondary electrons generated by each electron in the probe are used to form the image. The bandwidth of the detection system is comparable to the pixel rate, due to the short transit time effects. Extraction of secondary electrons is coaxial so that edge features are imaged identically regardless of their orientation upon the substrate.

Figure 4:
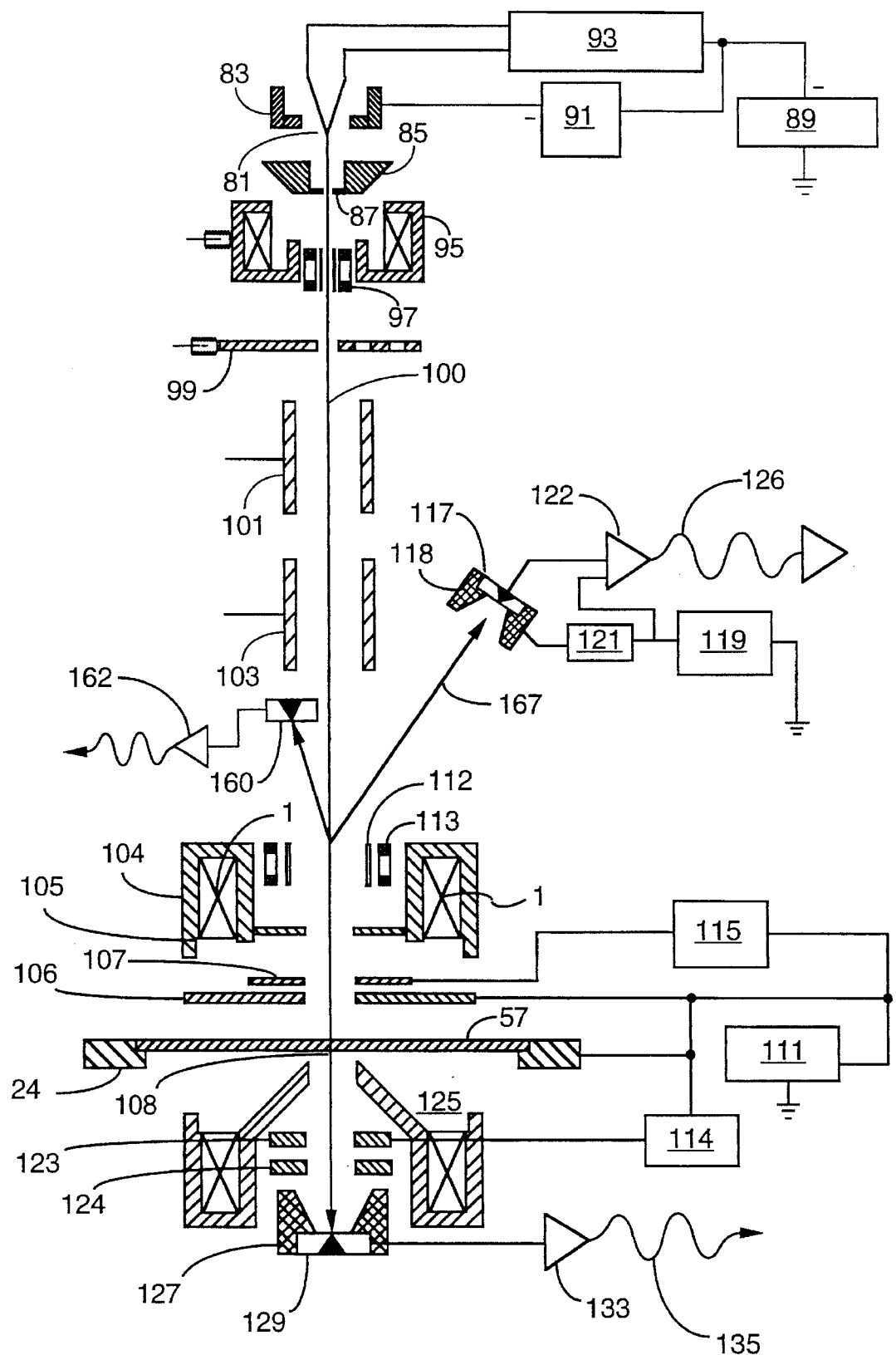
FIG. 4 is a schematic representation that shows the functional elements of the electron optical column and collection system.

FIG. 4 shows the elements of the optical subsystem and some of the associated power supplies necessary for understanding its function. The electron gun consists of a thermal field emission cathode 81, an emission control electrode 83, and an anode 85 having an anode aperture 87. Cathode 81 is held at a voltage of 20 KeV by power supply 89. Emission current, which depends upon the electric field strength at the surface of cathode 81, is controlled by the voltage on electrode 83 via bias supply 91, which is negative with respect to the voltage on cathode 81. Cathode 81 is heated by current supply 93. A magnetic condenser lens 95 near cathode 81 is used to collimate the electron beam. An upper deflection system 97 is used for alignment, stigmation and blanking. The optics are further apertured by beam limiting aperture 99 consisting of several holes. The beam 100 is deflected by a pair of electrostatic pre-lens deflectors 101 and 103, causing the beam to rock around a point above the objective lens 104. Objective lens 104 consists of lower pole piece 106, intermediate electrode 107 and upper pole piece 105. In the high voltage mode of operation only the magnetic elements 105, 106 of the objective lens are used to focus the probe. The beam is eventually scanned telecentrically over substrate 57. The approximately parallel beam is refocussed by the objective lens 104, forming a 1× magnified image of the source that illuminates substrate 57.

In the high voltage secondary electron imaging mode, secondary electrons are extracted up through the objective lens 104. Stage 24, substrate 57 and lower lens pole piece 106 are floated a few hundred volts negative by power supply 111 so that secondary electrons are accelerated to this energy before passing through deflectors 112 and 113. The intermediate electrode 107 is biased positive with respect to the stage via supply 115, and is used to accelerate the electrons as soon as they leave the substrate and to aid in the efficient collection of secondary electrons that emanate from depressed areas on the substrate. This combination of a floating stage 24 and an intermediate electrode 107 virtually eliminate any spread in electron arrival times at secondary electron detector 117. As they pass back up through the lens 104, the returning secondary electrons are deflected by deflectors 112 and 113 which act together as a Wien filter, and into detector 117. Here the return beam is reaccelerated to higher energy by power supply 119 in connection with anode 118 of detector 117 to cause the secondary electrons to impact the Shottky barrier solid state detector 117 at an energy level that is sufficient for amplification. Anode 118 of detector diode 117 is reverse biased by power supply 121. The amplified signal from detector diode 117 then passes to preamplifier 122 after which it is transmitted to the video acquisition pre-processor 48 (see FIG. 1) and associated electronics via a high voltage insulating fiber optic link 126. This signal constitutes the secondary electron component of signal 33 in FIG. 1.

To allow inspection of partially transparent substrates, a transmission electron detector 129 is located below stage 24. Transmitted electrons pass through substrate 57 at high energy and do not require reacceleration. The transmission electrostatic lens (consisting of upper element 123, middle element 124 and lower element 127) is used to spread the transmitted electron beam to a diameter suitable for detection by solid state detector 129. Electrode 123 is held at the same potential as stage 24, while electrode 124 is held at 0 to −3 KV by power supply 114. The signal from transmitted electron detector 129 is amplified by amplifier 133 and transmitted by fiber optic link 135 which is the transmitted electron component of 33 in FIG. 1.

The optical system is also designed to allow the collection of back-scattered electrons which leave the substrate surface at nearly the same energy level as primary electrons. Back-scattered electron detector 160 is a Shottky barrier diode detector similar to detector 117 that is located to the side of the beam axis. Somewhat different settings of the electrostatic and magnetic Wien filter deflectors 112 and 113, cause this beam to be deflected to the left onto the solid state detector 160, where the signal is amplified by pre-amplifier 162 and passed to pre-processor 48 (see FIG. 1).

For imaging with low voltage beams in the range of 500–1500 eV, elements of the objective lens system are biased considerably differently, and two specific new elements are used. Primary beam electrons are decelerated within the objective lens by floating the substrate 57, lower objective lens pole piece 106 and intermediate electrode 107 at about −19 Kv by means of supply 111. This technique allows the beam to be decelerated only near the end of its path, avoiding aberration and column interaction effects that would greatly degrade the image if the entire beam path were operated at lower beam energy. Under these conditions, the decelerating field between pole pieces 105 and 106 creates a considerable focussing effect. An additional snorkel lens 125 with a single active pole piece below the substrate provides most of the additional magnetic focussing field near the surface. The return flux of this lens passes through pole piece 106 to the outer shell of the snorkel lens. In addition to providing focussing, the strong magnetic field at the substrate assists in extracting low energy secondary electrons from deep features, and tends to keep the secondaries collimated as they are reaccelerated up the objective lens bore 104.

In the low voltage imaging mode, secondary electrons that leave the substrate at about 5 eV are reaccelerated to about 19 KeV within the objective lens. To minimize charging, it is desirable that these electrons pass through a short field free region near the surface. In the low voltage mode the leakage field from the objective lens would create an accelerating field at the substrate surface 57 were it not for the voltage level on intermediate electrode 107. In the low voltage mode, intermediate electrode 107 is biased negative with respect to electrodes 106 creating a field free region that can be adjusted by supply 115 for optimum low voltage imaging. After reacceleration, the secondary electrons pass through the Wien filter deflectors 112 and 113 where they are deflected to the left onto the same detector 160 that is used for backscatter imaging in high voltage mode. Thus the detected signal at preamplifier 162 constitutes the most important image signal used for inspection of wafers at low voltage. Detector 117 and 129 are not used in this mode for wafer inspection.

Figure 5:
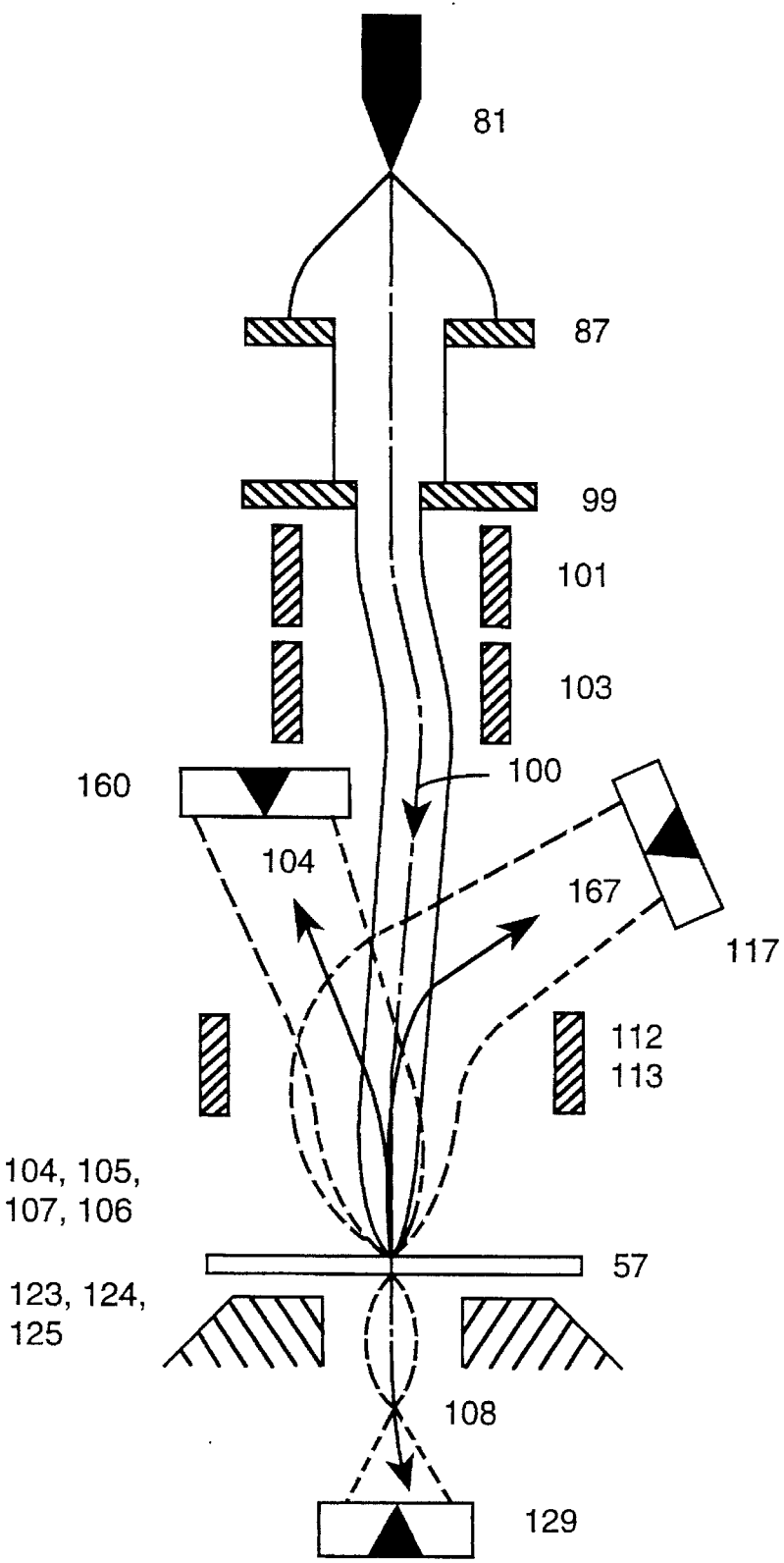
FIG. 5 is a simplified schematic representation of the paths of the primary, secondary, back-scatter and transmitted electrons through the electron optical column and collection system shown in FIG. 4.

FIG. 5 shows a schematic diagram of the various electron beam paths within column 20 and below substrate 57. Electrons are emitted radially from field emission cathode 81 and appear to originate from a very small bright point source. Under the combined action of the accelerating field and condenser lens magnetic field, the beam is collimated into a parallel beam. Gun anode aperture 87 masks off electrons emitted at unusable angles, while the remaining beam continues on to beam limiting aperture 99. Upper deflector 97 (FIG. 4) is used for stigmation and alignment, ensuring that the final beam is round and that it passes through the center of the objective lens consisting of elements 105, 106 and 107 (FIG. 4). Condenser lens 95 (see FIG. 4) is mechanically centered to the axis defined by cathode 81 and limiting aperture 99. The deflection follows the path shown, so that the scanned, focussed probe (beam at point of impact with the substrate) emerges from the objective lens 104.

The diameter of the scanning beam 100 and its current are determined by several factors. The angular emission from the source (1.0 Ma/steradians), and the aperture angle defined by final aperture 99 determine the beam current. The probe diameter is determined by aberrations in both lenses, which are designed for high excitation (field width/focal length) to minimize both spherical and chromatic aberration. The effect of beam interactions (i.e. statistical blurring due to repulsion between individual beam electrons) are also important in this high current system, accounting for about half the probe size on substrate 57. These effects are minimized by avoiding intermediate crossovers, by using a short beam path (40 cm.) and by using lenses with relatively large half angles at the source and substrate 57. To obtain a given spot size, the aperture diameter is chosen to balance all these effects while providing maximum possible current. In this system spot size is primarily adjusted using the aperture, although it is possible to change lens strengths to magnify or demagnify the beam from the source.

In High Voltage mode, Wien filter deflectors 112 and 113 (see FIG. 4) deflect the approximately 100 ev secondary electron beam 167 into detector 117 without substantially influencing the higher energy scanning beam 100. The Wien filter consists of electrostatic octopole deflector 112 and quadropole magnetic deflector 113, arranged so that the electric and magnetic fields are crossed (perpendicular to each other). Returning secondary electrons are deflected sideways by both fields. However, since primary scanning electrons 100 are travelling in the opposite direction, the strength of these fields may be chosen so that the Wien filter exerts no force upon the primary scanning beam 100 even though it deflects the secondary beam 167 through a large angle. This so called "Wien filter" is used effectively for coaxial extraction. The anode 118 of secondary electron detector 117 is shaped so that during reacceleration, beam 167 is collected and refocussed upon the collector of solid state detector 117.

The paths of detected transmitted and back-scattered electrons are also shown in FIG. 5. To detect back-scattered electrons in high voltage operation, and secondary electrons in low voltage operations, the Wien filter 112 and 113 is excited differently, so that these electrons follow the path shown up the system to the back-scatter detector 160. When partially transparent masks are imaged, electrons can also pass through the substrate surface 57 without losing all their energy. These transmitted electrons pass through electrode system 123 and 124 (FIG. 4) which acts as a lens to spread out the transmitted beam 108 before it hits the detector 129. When transmitted signals are to be obtained in the high voltage mode, a hole in the Snorkel lens 125 allows them to pass without substantially influencing the lens field necessary for low voltage secondary imaging.

In low voltage mode operation, where the substrate 57 and electrodes 106, 107 are floated at high voltage, the objective lens operates quite differently even though the beam paths are similar. Snorkel lens 125 applies a magnetic field which extends through the substrate 57 and into pole piece 106 above. As the electrons decelerate in the field between electrodes 105, 106 and 107, further refraction occurs resulting in a relatively short effective focal length. This kind of decelerating immersion lens has remarkably low aberrations. It differs from conventional cathode lenses used in emission microscopy, insofar as electrode 107 is biased negatively to form a short electric field free region near substrate 57. With this electrode, it is possible to bias the surface in such a way that some low energy secondary electrons return to the substrate to neutralize charging effects.

Those secondary electrons that escape the field free region are re-accelerated in the region between electrodes 107 and 105. They emerge from electrode 105 at an energy approximately equal to the 20 KeV primary beam energy from the gun minus their landing energy on the substrate. In the objective region, the secondary paths are similar to the primary beam, but at much larger angles since secondaries are emitted with a broad angular distribution. This secondary electron beam is directed toward the low voltage secondary electron detector 160 which is the same detector used for backscatter imaging at high voltage. Since the energy of the returning secondary beam 109 is comparable to the primary beam energy, much stronger Wien filter 112 and 113 deflections are required, but this can be done without substantially influencing the primary beam path 100.

Since the low voltage mode is frequently to be used for the inspection of partially insulating surfaces, the techniques used to minimize charging are an important aspect of the present invention. Charging of an insulating region occurs when the number of secondary electrons (low energy secondaries & backscatters) does not equal the number of primary beam electrons incident upon the surface. For any surface that gives an image, this charge balance varies depending upon the topography and material. The secondary electron scattering yield varies with the energy of the incident beam, but for most materials is greater than one in the range of about 200–1500 eV and otherwise less than one. When the yield is greater than one, the surface will charge positive.

Secondary electrons leave the surface of substrate 57 with energies in the range of 0–20 eV with the most probable energy near 2.5 eV. If the electric field near the surface of substrate 57 can be controlled, in this case by the potential upon intermediate electrode 107, secondary electrons can be encouraged to leave that surface or return to it, depending upon the applied field and the energy that they leave with. For example if an approximately 10 eV retarding potential barrier is established, then only some of the secondaries emitted from a point on the surface 57 would escape to the detector.

If the number of escaping secondary and backscattered electrons is greater than the number of primary beam electrons, surface 57 will charge positively which will increase the size of the retarding potential barrier created by electrode 107. Fewer low energy secondary electrons will now escape. The surface potential will move positively until balance is reached. If the number of escaping secondary and backscattered electrons is less than the number of primary electrons, the surface will charge negatively, which will lower the retarding potential barrier created by electrode 107. A larger number of low energy secondary electrons will now escape. The surface potential will move negatively until balance is reached. Under these conditions, a stable surface potential will emerge after some period of time. To avoid creating large potential differences between areas on the substrate, it is essential to properly adjust electrode 107 so that the equilibrium condition (primarily beam current equal to secondary electron current) is obtained on average.

Since topographical and material differences affect the secondary electron yield, different areas on a substrate will tend to different equilibrium voltages. However, in equilibrium all areas produce the same number of secondary electrons. This means that there is no contrast for substrates imaged in the equilibrium state. To circumvent this problem the dose per pixel is kept very low and if necessary the area rescanned by the "multiple frame scan" technique described earlier to obtain favorable image statistics.

By controlling the time between scan passes, the surface has the opportunity to neutralize in-between scans, using electrons generated in adjacent regions. The key elements in this strategy are the field controlling electrode 107, and the overlapping frame scan trajectory.

Figure 6:
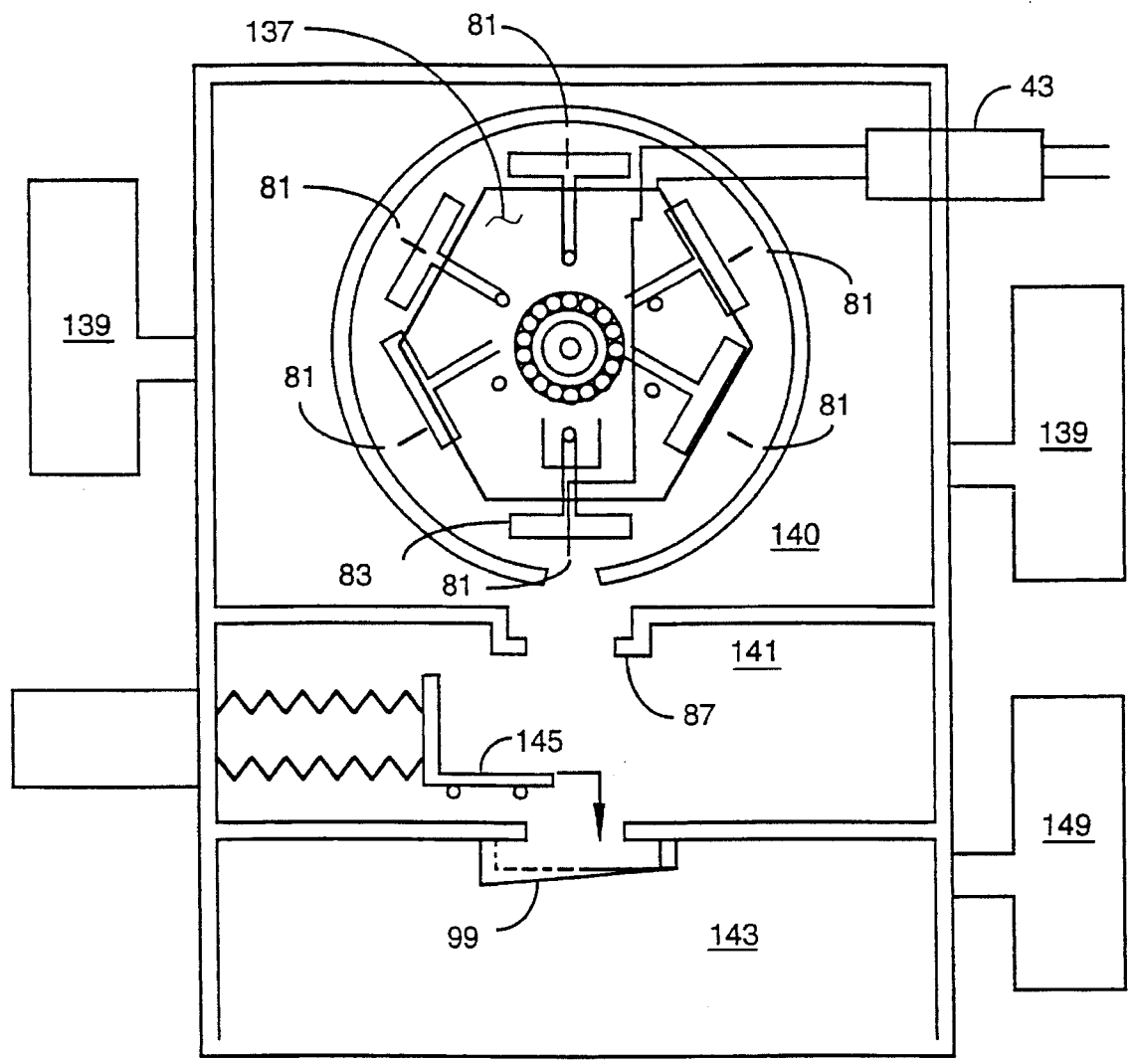
FIG. 6 is a simplified schematic representation of a multi-head electron gun and vacuum configuration.

As shown in FIG. 6, to maximize gun reliability in the face of limited cathode lifetime, the gun structure contains six cathode/control electrode assemblies mounted upon a hexagonal rotating turret 137 floating at high voltage. Each assembly may be rotated into position above anode aperture 87, and locked into position while making electrical contact with the appropriate power supplies, 91 and 93 (FIG. 4).

The electrostatic deflection system, consisting of pre-lens deflectors 101 and 103 (see FIG. 4), requires very homogeneous fields driven by high speed sawtooth deflection voltages. The structure is a monolithic ceramic/metal assembly etched to form 20 individual deflection plates. Four drivers are required for each of the two stages, to provide a scan that can be rotated to match the stage 24 and substrate 57 coordinate systems.

Automatic tuning and set up are provided for operator ease. Lens and deflection/stigmation elements and all high voltage supplies are under DAC control, interfaced to column control computer 42 (see FIG. 1). In several cases, routines to adjust deflection ratios and electrostatic plate voltages for specific functions are resident in the column control computer 42, and gun control and setup is based on nominal values, modified by adaptive routines using A/D feedback for emission current, aperture current, and supply settings.

Beam centering is based upon other well known routines that eliminate deflections when lens currents are changed. These operations use specific test samples imaged by a two axis frame scan function, and they exploit image analysis capability that is also necessary for alignment and inspection. Focus is maintained automatically to compensate for substrate height variations, while stigmation is performed prior to inspection. These routines are based upon analysis of the contrast and harmonic content of images using the acquisition pre-processor 48 and related electronics.

In the present invention the nominal operating conditions of the optics for high voltage mode are a 20 keV beam energy and beam current spot size relationship varying from 300 nA at 0.05 μm to 1000 nA at 0.2 μm. The scan period is 5 microseconds using a 512 pixel scan field imaged at 100 Megapixels/sec. Detector 117 current amplification in the diode is about 1000× at 5 KV to 5000× at 20 keV. The overall system can perform over this range of operating conditions for samples of more than about 14% edge contrast at 100 Megapixels/sec using a 0.05 micrometer spot. The acquisition electronics makes provision for integrating more than one scan line, allowing lower contrast or high resolution images to be recorded at lower bandwidth.

In low voltage mode, the beam energy up to electrode 105 is 20 KeV and the beam energy at the substrate is 800 eV. The beam current spot size relationship is 25 na at 0.05 μm and 150 na at 0.1 μm. The scan period and field size are the same as high voltage mode. Detector 160 amplification is 5000×. The system can perform over this range of operating conditions for samples of more than about 20% of edge contrast at 100 megapixels/sec using a 0.05 micrometer spot.

DEFECT PROCESSOR

In the case of die-to-die inspection, the function of defect processor 56 is to compare image data derived from die 68 with image date derived from die 70, or, in the case of die-to-database inspection, to compare image data derived from die 64 with data derived from the database adaptor 54. The routines and the basic implementation of defect processor 56 are substantially the same as those of the defect processor described in U.S. Pat. No. 4,644,172 (Sandland et al; "Electronic Control of an Automatic Wafer Inspection System", issued Feb. 17, 1987 and assigned to the same assignee as the present application) which uses three parameters to determine defect locations whereas the present invention uses four.

All data for either die-to-die or die-to-database inspection are received either from memory block 52 or, after alignment correction, from the alignment computer 21 (depending on how the alignment correction is implemented), and are in the form of six bits per pixel for each detector type. In defect processor 56 four parameters are determined for each pixel for each type of detector of both inputs:

a. I, the gray scale value of the pixel;

b. G, the magnitude of the gradient of the gray scale pixel;

c. P, the phase or direction of the gradient of the gray scale value; and d. C, the curvature of the local gradient contour.

The gray scale value is merely the value in memory block 52 for the particular pixel. The magnitude of the gradient and the direction of the gradient are derived from first computing the x and y Sobel operator components:

$$S_x = \begin{pmatrix} -1 & 0 & 1 \\ -2 & 0 & 2 \\ -1 & 0 & 1 \end{pmatrix} \quad S_y = \begin{pmatrix} 1 & 2 & 1 \\ 0 & 0 & 0 \\ -1 & -2 & -1 \end{pmatrix}$$

The magnitude of the gradient is then $((S_x)^2+(S_y)^2)^{1/2}$ and the direction is $\tan^{-1}(S_y/S_x)$.

The curvature is defined as:

$$C = \begin{pmatrix} a_{11}R_{-2,-2} & a_{12}R_{-2,-1} & a_{13}R_{-2,0} & a_{14}R_{-2,1} & a_{15}R_{-2,2} \\ a_{21}R_{-1,-2} & a_{22}R_{-1,-1} & a_{23}R_{-1,0} & a_{24}R_{-1,1} & a_{25}R_{-1,2} \\ a_{31}R_{0,-2} & a_{32}R_{0,-1} & a_{33}R_{0,0} & a_{34}R_{0,1} & a_{35}R_{0,1} \\ a_{41}R_{1,-2} & a_{42}R_{1,-1} & a_{43}R_{1,0} & a_{44}R_{1,1} & a_{45}R_{1,2} \\ a_{51}R_{2,-2} & a_{52}R_{2,-1} & a_{53}R_{2,0} & a_{54}R_{2,1} & a_{55}R_{2,2} \end{pmatrix}$$

where the coefficient $a_{ij}$ is a set of parameters selected depending on the application and $R_{ij}$ is defined to be:

$$R_{ij} = \begin{pmatrix} b_{11}I_{-1,1} & b_{12}I_{-1,0} & b_{13}I_{-1,1} \\ b_{21}I_{0,1} & b_{22}I_{0,0} & b_{23}I_{0,1} \\ b_{31}I_{1,1} & b_{32}I_{1,0} & b_{33}I_{1,1} \end{pmatrix}$$

Where $I_{ij}$ is the gray scale value of a pixel in the $i^{th}$ column and the $j^{th}$ row of the image and $a_{ij}$ and $b_{kl}$ are parameters derived empirically.

Typical values for the preferred embodiments are:

$$b_{ij} = \begin{pmatrix} 1 & 2 & 1 \\ 2 & 4 & 2 \\ 1 & 2 & 1 \end{pmatrix} \quad a_{ij} = \begin{pmatrix} 0 & -1 & 2 & -1 & 0 \\ -1 & 2 & -2 & 2 & 1 \\ -2 & -2 & 0 & -2 & -2 \\ -1 & 2 & -2 & 2 & -1 \\ 0 & -1 & 2 & -1 & 0 \end{pmatrix}$$

In the manner described above, quantities I, G, P and C are determined for each pixel of both images. For any given pixel A of die 68, these parameters are then compared with the same parameters of the corresponding pixel, B, on die 70 and also with the parameters of the eight pixels immediately adjacent to B. If for every pixel in the neighborhood of B at least one parameter differs from the same parameter of pixel A by a value greater than a predetermined tolerance, pixel B is flagged as a defect of both dice.

In a similar manner, the parameters of every pixel of die 70 are compared with the parameters of pixels in the corresponding neighborhood of die 68 and the appropriate pixels are flagged as being defective.

The physical implementation of this algorithm is performed in pipeline logic, as described in U.S. Pat. No. 4,644,172 (Sandland et al; "Electronic Control of an Automatic Wafer Inspection System", issued Feb. 17, 1987 and assigned to the same assignee as the present application). The matrix operations are implemented in Application Specific Integrated Circuit (ASIC) devices which are cascaded in a pipe line computational system capable of computing defect data at a rate of 100 Megapixels/second.

DEFLECTION CONTROLLER

Figure 7:
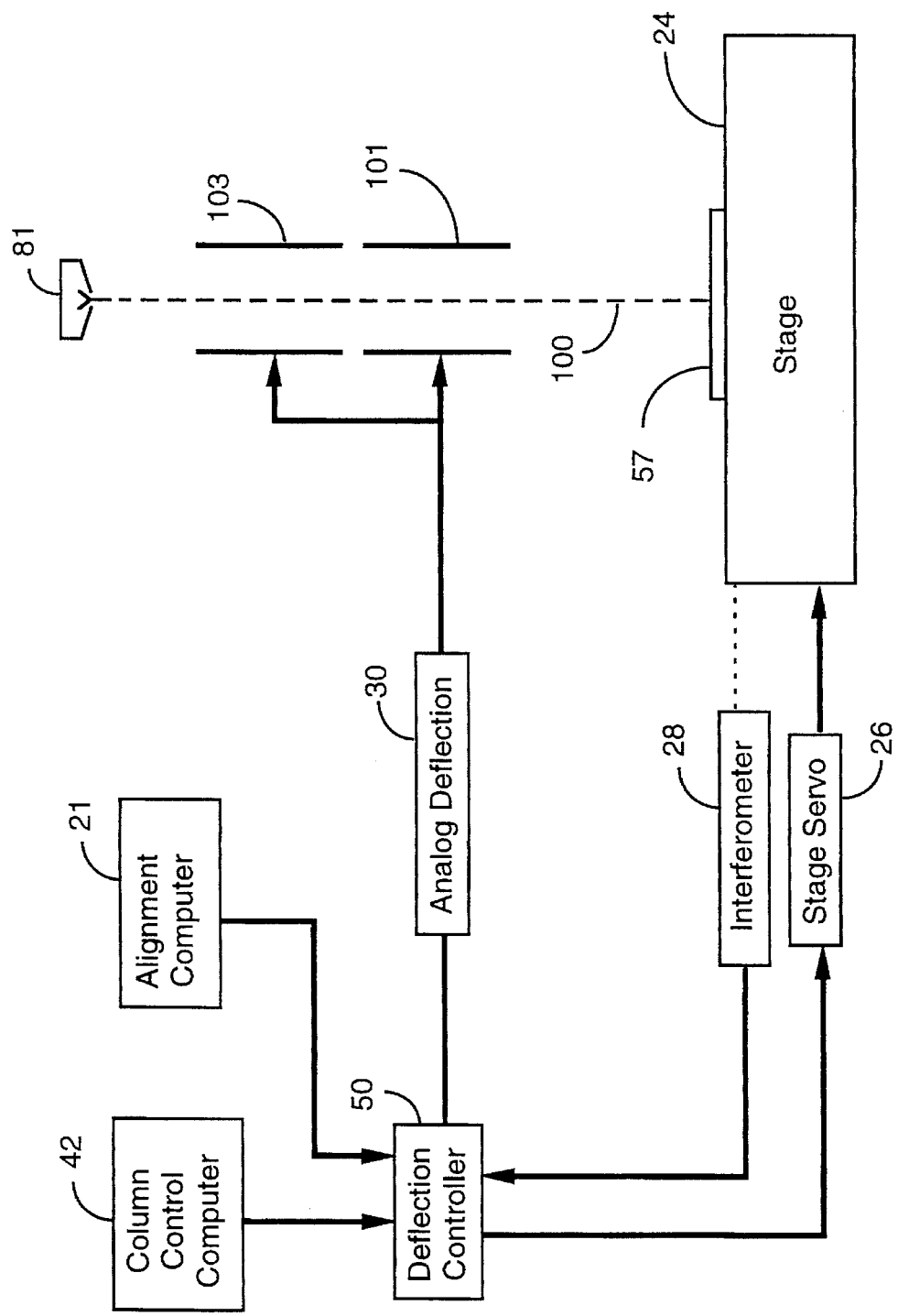
FIG. 7 is a block diagram of the positioning control subsystem of the present invention.

In die-to-die mode, the function of deflection controller 50 is to position the electron beam 100 at equidistant grid points within each swath 60 of die 68 so that the outputs of the detectors 129, 160 and 117 can be compared with the outputs of the same detectors at the corresponding location on die 70. Similarly, in die-to-database mode the simulated image derived from database adaptor 54 is compared with the detector 117 output from a die. Deflection controller 50 accomplishes this by controlling the positions of stage 24 and of electron beam 100 as shown in FIG. 7 and explained below.

When scanning the first die in a swath, the output of alignment computer 21 is set to zero, because during the scanning of the first swath of the first die there cannot be a misalignment. Therefore, during this period, deflection controller 50 receives its instruction only from column computer 42. Based on these instructions and the position data received from the x and y interferometers 28, deflection controller 50 calculates the desired motion of stage 24 and transmits corresponding signals to stage servo 26 to move stage 24 accordingly. Deflection controller 50 similarly calculates the desired deflection of beam 100 and transfers this data to analog deflection circuit 30. As stage 24 moves, its position is constantly monitored by x and y interferometers 28 and any discrepancies from the desired stage position are determined and used to generate an error signal which is fed back to the stage servo drive 26 by deflection controller 50. Because of the high inertia of stage 24, these error signals cannot correct for high frequency errors in the stage position. The high frequency errors, in both x and y, are corrected by the deflection of electron beam 100, as computed by deflection controller 50 which transmits these signals in digital form to analog deflection circuits 30.

As beam 100 scans die 68, gray scale values are stored in memory block 52. As soon as electron beam 100 starts scanning die 70 these values are also stored in memory block 52 and are immediately also transferred both to defect processor 56 and alignment computer 21. In alignment computer 21 the two data streams, one derived from die 68 and another from die 70, are compared for alignment. If there is a misalignment, an alignment correction signal is generated and transferred to deflection controller 50. This alignment signal is then used as a vernier correction to position beam 100 at the correct location on substrate 57.

In die-to-database mode, deflection controller 50 functions similarly to the way it functioned in the die-to-die mode, except that the output of database adaptor 54 replaces the input image derived from the first die in the swath.

The deflection controller 50 also computes and defines the stage 24 motion, speed and direction, as well as the parameters of the electron beam deflection.

ALIGNMENT COMPUTER

The function of alignment computer 21 is to accept two digitized images in the form of gray scale values, and determine, in terms of fractional pixel distances, the misalignment between these images. The preferred embodiment of these alignment calculations is described in U.S. Pat. No. 4,805,123 (Specht et al; "Automatic Photomask and Reticle Inspection Method and Apparatus Including Improved Defect Detector and Alignment Sub-System" issued Feb. 14, 1989 and assigned to the same assignee as the present application). In this preferred embodiment the alignment correction is continuously calculated throughout the entire care area. The calculated alignment correction may be used by the alignment computer to shift, or to shift and interpolate (for a subpixel shift) the images read from memory block 52 and sent to the defect processor so that the images are correctly aligned when examined by the Defect Processor 56. Alternately, one may select a few specific features on the substrate 57, and calculate the misalignment only at these features, assuming that alignment does not change rapidly throughout the scanning process. In the latter case, a single board computer, such as the Force Computer, Inc. model CPU 30ZBE may be used to perform the alignment calculations. These calculated shifts may be used to shift the positions of subsequent data acquisitions to reduce misalignments or may be used to determine shifts between the images that are sent from the memory block 52 to the defect processors 56.

ANALOG DEFLECTION

Figure 9:
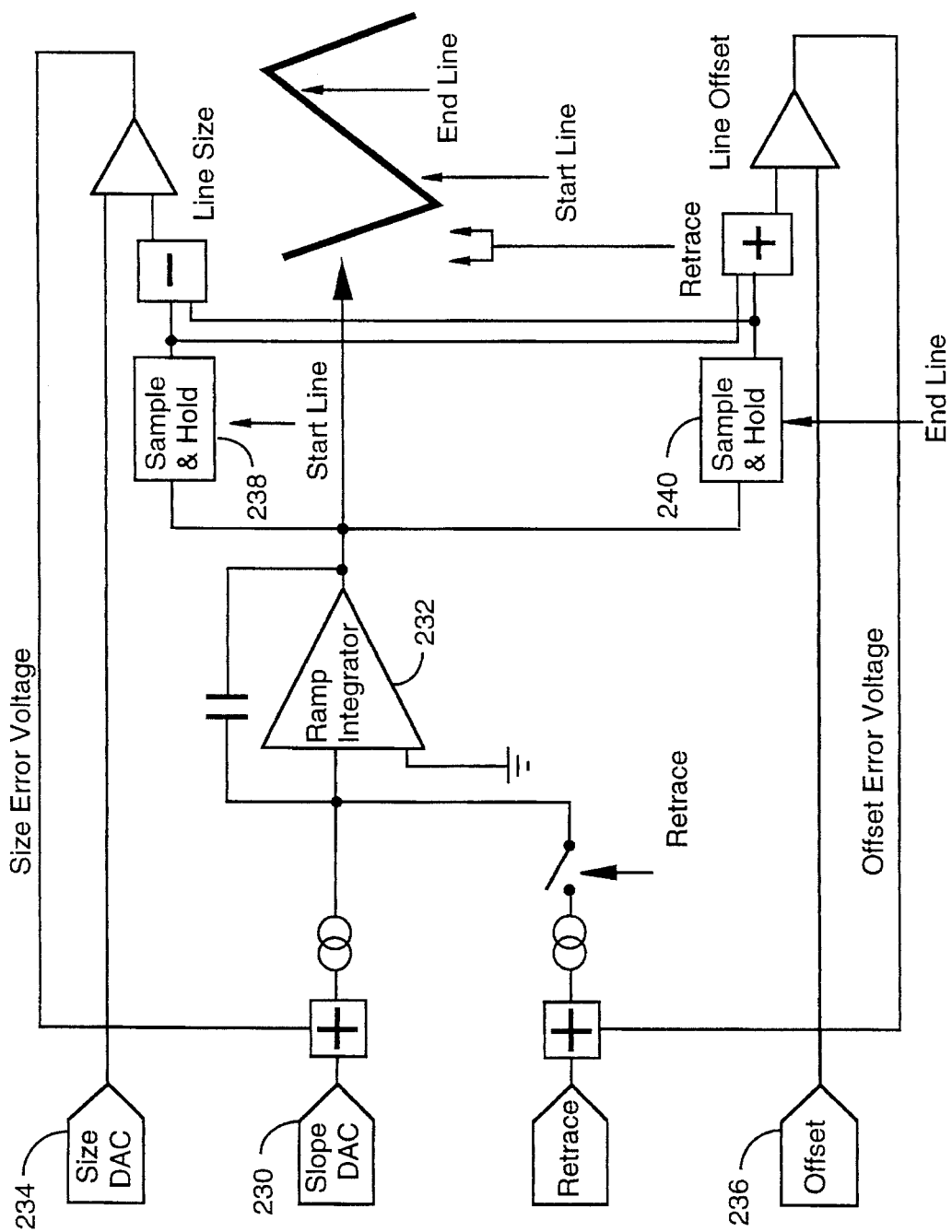
FIG. 9 is a block diagram of the analog deflection system of the present invention.

Analog deflection circuit 30 generates analog ramp functions for deflector plates 101 and 103 (FIG. 4). The operation of this subsystem is shown in FIG. 9. The digital signal derived from deflection controller 50 is converted to an analog voltage by slope DAC 230 the output of which feeds ramp generator 232. The amplitude of the ramp is variable through the use of DAC 234, while the offset is controlled by DAC 236. Sample and hold circuits 238 and 240 are used to define the start and the end of the ramp, respectively. High voltage, low noise drivers then amplify the waveform to produce a ramp with a dynamic range of +/−180 V which is applied to deflector plates 101 and 103.

MEMORY BLOCK

The Memory Block 52 consists of three identical modules, with each one corresponding to a different one of each type of detectors 117, 129 and 160.

Figure 10:
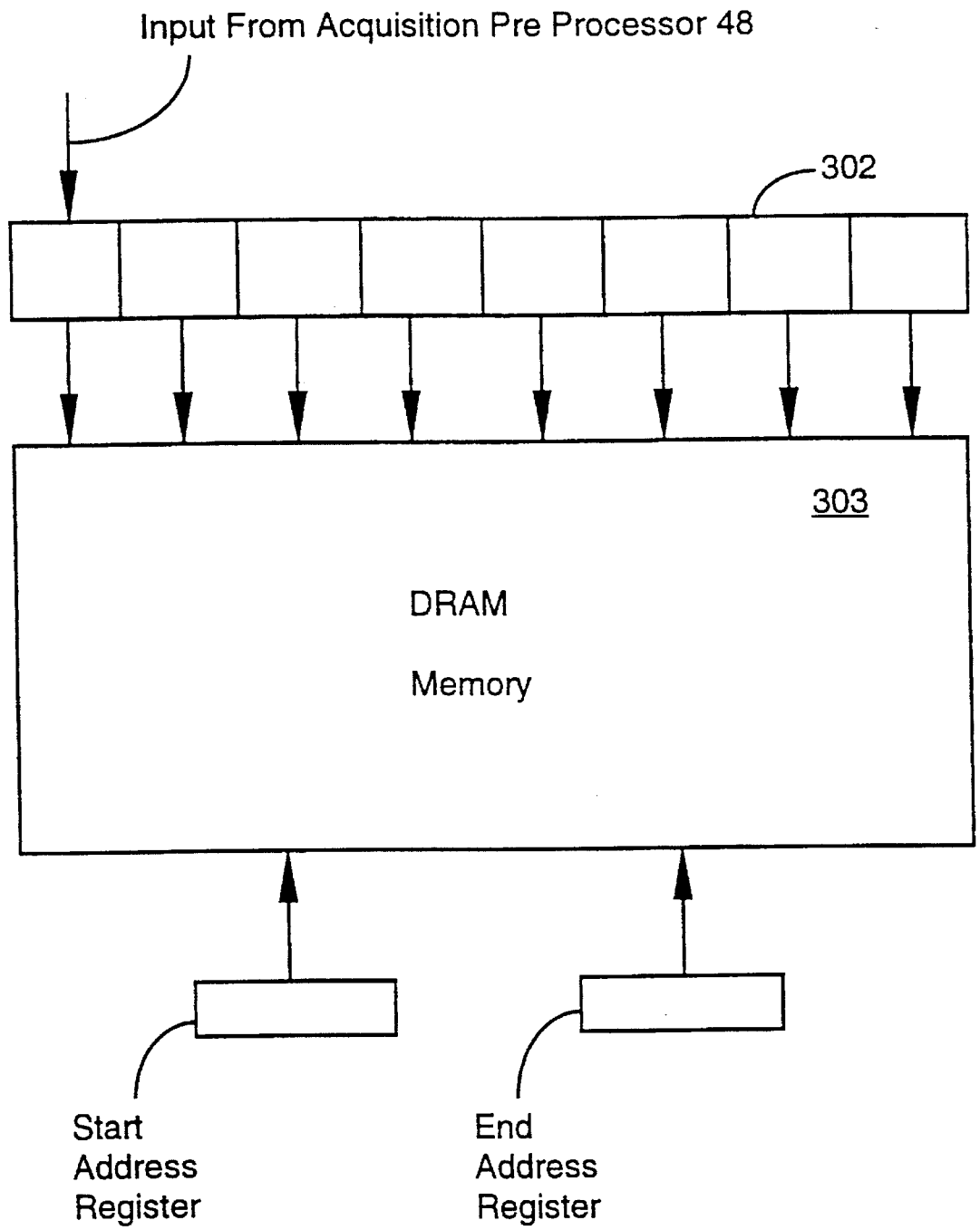
FIG. 10 is a block diagram of the memory of the present invention as shown in FIG. 1.

Referring to FIG. 10, conceptually, each module of memory block 52 consists of two FIFOs (First In—First Out) memories. The first FIFO stores the gray scale values corresponding to each detector of an entire swath derived from die 68, while the second FIFO is much shorter and stores the gray values, again for each detector, corresponding to only a few scans of die 70. The outputs from these two FIFOs are then transmitted to defect processor 56 and alignment computer 21. Each FIFO functions at a rate of 100 Mhz and stores each pixel's gray scale value with a precision of 8 bits per detector.

The memory accepts in its input register 302, 8 bytes in parallel from acquisition pre-processor 48 for each type of detector. Input register 302, acting like a shift register, shifts the eight bytes to the right and then accepts another eight bytes, until such time that the eight sections of the input register a full. At that time all 64 bytes are clocked into memory 303.

One way to implement this is with DRAMs 303. Ordinarily 128 megabytes would be used in a system.

ACQUISITION PRE-PROCESSOR

Acquisition pre-processor 48 converts the analog signal from each detector 117, 160 and 129 and digitizes these to an eight bit value at a rate of 100 Mhz, then reformats the output signal for storage in memory block 52.

Figure 11:
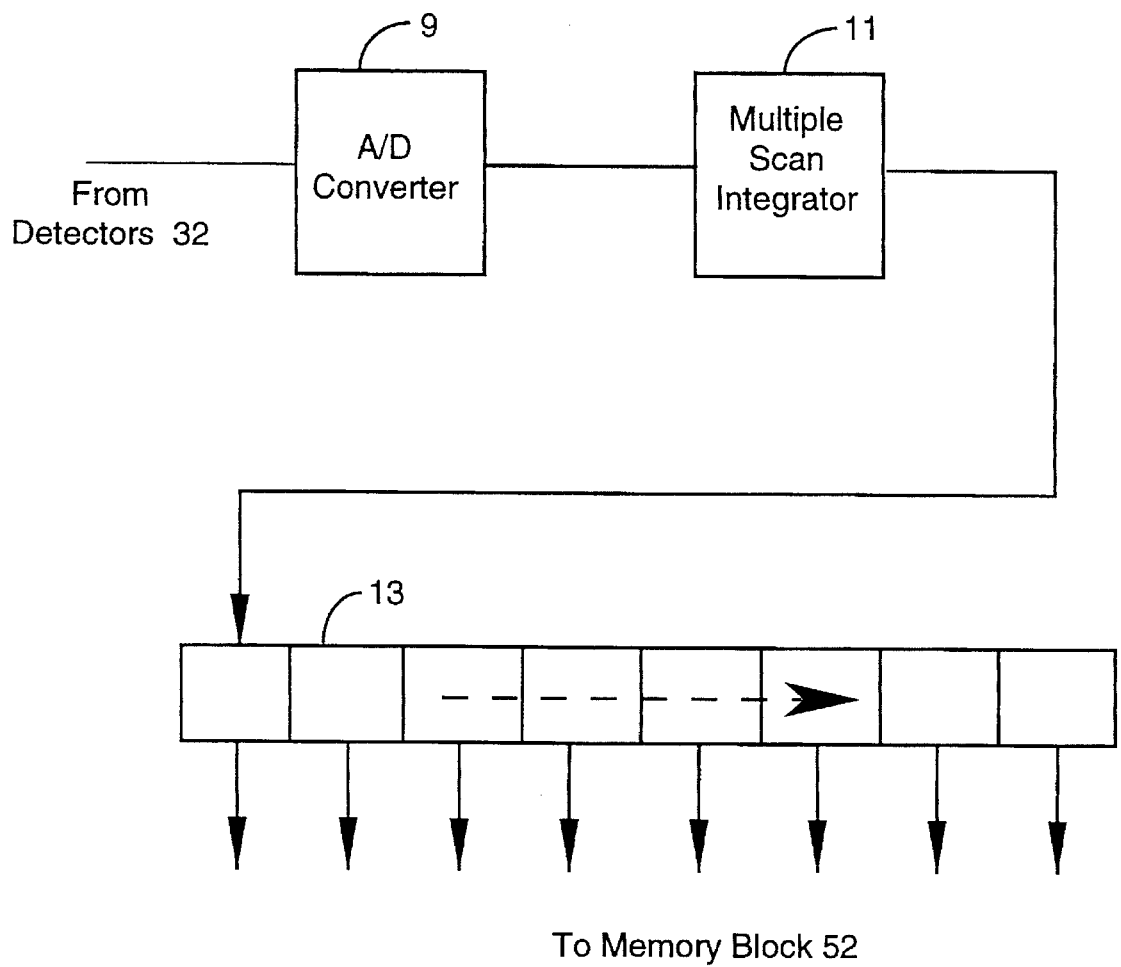
FIG. 11 is a block diagram of the acquisition pre-processor of the present invention.

Acquisition pre-processor 48 consists of three identical modules, one of which is shown in FIG. 11. Each module accepts an output from its corresponding detector and digitizes that output to an accuracy of 8 bits and then places it into multiple scan integrator 11. The purpose of multiple scan integrator 11 is to average the gray scale values from the same pixel for the reduction of noise. Under certain circumstances the pixel may be rescanned, i.e. resampled several times and the resultant value is the average of the values for that pixel. This value is then transferred to shift register 13 which accepts eight bytes in series before transferring them in parallel to memory block 52.

INTERFEROMETERS

The x and y positions of stage 24 are monitored by x and y interferometers 28, such as Teletrac TIPS V. The positions are defined to 28-bit precision where the least significant bit corresponds to approximately 2.5 nanometers.

SYSTEM COMPUTER

Overall control of system 10 is provided by a system computer 36 which, among its other housekeeping tasks, ensures that various step sequences are performed in an orderly manner. Each event in the sequence is accomplished at the programmed time, with a number of nonconflicting sequences performed simultaneously to maximize throughput of computer 36.

The routines preformed by computer 36 are designed such that user interaction with the system is either through keyboard 40 with an associated mouse or trackball pointing device, or by data communication with a remote computer. For local interaction, computer display 38 displays graphics and text from system computer 36.

The system computer 36 routines are organized into four communicating "tasks". These are:

1. A Master Task through which passes all communication with column control computer 42, post processor 58, and mask handler 34. This task also maintains files on the system computer that record machine operating parameters such as lens settings, vacuum pressures, and beam currents.

2. A User Interface Task that manages displays on computer display 38 and that handles keyboard 40 and mouse input. This task responds to user keyboard 40 and mouse input by modifying data files and by sending messages to other parts of the system to initiate actions.

3. An Inspect Task that sends descriptions of image acquisition swaths to column control computer 42 (via the Master Task).

4. A Command Language Interpreter Task that can accept command inputs from keyboard 40. This task also manages timers that enable the automatic scheduling of repetitive operations. In addition, this task creates and updates a text logfile describing all machine operations and the time they occurred. Normally this task is only used for machine control by service engineers.

An example of a system computer is a Sun Microsystems SPARC processor that runs under a UNIX operating system. (UNIX is a registered trademark of AT&T.)

COLUMN CONTROL COMPUTER

Column control computer 42 consists of the autofocus computer, vacuum control computer and deflection instruction computer. The functions and implementation of the autofocus computer is covered under the headings Autofocus System and the Vacuum System is described under the heading of Vacuum System.

Column control computer 42 receives its instructions from system computer 36.

The column computer 42 is implemented in a 68030-based single board computer, such as the CPU 30ZBE made by Force Computer, Inc.

POST PROCESSOR

Post processor 58 receives from defect processor 56, a map that identifies every defective pixel for each type of detector. The post processor 58 concatenates these maps to determine the size and location of each defect and classifies these by defect type. These data are then made available to system computer 36. Physically, post processor 58 can be implemented as a 68030 single board computer, such as model CPU 30ZBE made by Force Computer, Inc.

VIDEO FRAME BUFFER

Video frame buffer 44 is a commercially available video frame memory with a storage capacity of 480×512 pixels, at 12 bits per pixel. A suitable frame buffer is the Image Technology, Inc. model FG100V. The video frame buffer refreshes image display 46 30 times a second.

IMAGE DISPLAY

Image display 46 is a commercially available color monitor, such as the SONY model PVM 1342Q. False color techniques are employed to aid the evaluation of the image by the operator. Such techniques assign different colors to the different gray shade values of a monochromatic image.

DATABASE ADAPTOR

Database adaptor 54 is an image simulator that produces gray scale values corresponding to each pixel on the basis of computer aided design data used for the making of the pattern in the die. Typically, the input to the database adaptor is a digital magnetic tape in a format used for the generation of the pattern for the integrated circuit. These digital data are then converted to a stream of pixel data organized in swaths, in the same format as the output of acquisition pre-processor 48. Such a database adaptor was previously disclosed in U.S. Pat. No. 4,926,489 (Danielson et al; "Reticle Inspection System" issued May 15, 1990 and assigned to the same assignee as the present application).

SUBSTRATE HANDLER

The function of substrate handler 34 is to automatically extract substrate 57 from the cassette and place it in the substrate holder in the proper orientation. It is a robotics device that is similar to wafer handlers in common use for transporting and manipulating wafers in the semiconductor industry. The first function of the handler is to determine the orientation of the flat 59 of FIGS. 2 and 3a. Handler 34 senses the flat optically with a linear CCD sensor oriented radially with respect to the rotational center of the substrate. As the substrate rotates, the output of the image sensor is converted to digital form and is then stored in a single board computer, such as the Force Computer, Inc. CPU 30ZBE. The computer determines the location of flat 59. The substrate is then rotated into the proper orientation and automatically placed into a substrate holder. The holder, now containing the substrate, is loaded into load elevator 210 of FIG. 8. All operations of the handler are executed under the control of system computer 36.

STAGE

The function of stage 24 is to move substrate 57 under electron beam 100 and under optical alignment system 22. In order to minimize the complexity of the system, stage 24 has been selected to only have two degrees of freedom: x and y; it can neither rotate nor move in the direction perpendicular to the x-y plane of substrate 57. In other words, the stage can only be translated in x, y or diagonal directions. Instead, rotation of the E-Beam raster is accomplished electronically, by resolving any scan into the two components of the electrostatic deflection of the beam and also moving the stage with the mechanical servos in a similar manner. Z-axis motion is not required because the objective lens has sufficient range in its variable focus to compensate for any height variations in substrate.

The stage 24 is a precision device with closely controlled straightness, orthogonality and repeatability. Crossed roller bearings are employed. The stage is vacuum compatible and nonmagnetic, so as not to interfere with electron beam 100. It has an open frame, so that transmission electron beam 108 can reach detector 129 below it. The open frame is also used to place substrate 57 on it from below in the loading process.

Three-phase brushless linear motors (not shown), two per axis, have been selected to drive stage 24 for best overall system performance. Suitable linear motors are the Anoline models L1 and L2 made by Anorad, Inc.

VACUUM SYSTEM

The entire vacuum system is under the control of column control computer 42. Conventional pressure sensors (not shown) within various parts of the system measure the pressure and report this to column control computer 42. This computer then sequences various valves, as necessary, on start-up or during the loading or unloading of a substrate. The latter routine is explained in more detail under the heading of Load Operation. Should the vacuum be inadequate for the electron beam operation, the high voltage is automatically cut off to protect source 81 from damage. This done with pressure sensors in combination with computers 42 and 36. Simultaneously, pneumatic isolation valve 145 (FIGS. 6 and 8) is also actuated to protect the ultrahigh vacuum region 140 of the column from contamination. The operation of the vacuum system is explained in detail below.

The vacuum system of the gun is a two stage differentially pumped system designed to be pre-baked and otherwise to be maintained indefinitely without servicing. Ultra High Vacuum, (approximately $10^{-9}$ Torr) region 140 is pumped by ion pumps 139 and isolated by gun anode aperture 87. Intermediate (approximately $10^{-8}$ Torr) vacuum region 141 is also ion pumped, by pump 149, and is separated from main system vacuum region 143 by pneumatic gun isolation valve 145 and by aperture assembly 99. Together these vacuum elements provide an environment suitable for field emission in a production environment.

The vacuum in lower column region 143 is maintained by turbopump 204 just as the vacuum in inspection chamber 206 is provided by turbopump 208. Inspection chamber 206 is separated from lower column region 143 by a plate which has a small hole through which the electron beam can pass. This separation of vacuum regions 206 and 143 permits high vacuum to be maintained even when the substrate to be inspected is coated with a photoresist material which typically has a significant vapor pressure.

The vacuum system has two air locks, 224 and 226, one to load a substrate 57 into inspection chamber 206 and one to unload the substrate after inspection. Each chamber is connected to the vacuum pumps via two valves, 212 and 214, in a parallel configuration. Valve 212 is for slow pumping of the lock chamber 224 while valve 214 has a large orifice and is able to handle a large volume. A similar arrangement, also shown using valves 212 and 214, is provided for chamber 226. The purpose of this dual arrangement is to preclude particles being stirred up in the evacuation process and yet minimize the time required for evacuation and repressurization of the chambers.

As will be explained in more detail below, initially, after the substrate has been placed in load lock 224, only the slow valve 212 is opened, thereby ensuring that the flow rate in the chamber is sufficiently slow so as not to stir up particles in the lock area 224. Once the pressure in the chamber has been reduced to a level that the air flow is in the free molecular flow region, a region where particles are no longer stirred up, the large valve 214 is opened in order to rapidly evacuate the remaining air in the lock. A similar two-step operation is used in the repressurization process, where valves 228 and 230 provide fast and slow venting for each chamber 224 and 226.

LOAD OPERATION

As previously described, substrate 57 is mated with an adaptor in mask handler 34 and is placed into load elevator 210. Load lock 224 is, at this time, at atmospheric pressure. Valve 212, a valve that permits only slow evacuation of the load lock 224, opens. When lock 224 has reached a pressure where the flow becomes molecular, valve 214, a high capacity valve, is opened and the remainder of the air is pumped out. Now gate valve 216 is opened and elevator 210 pushes substrate 57 holder through valve 216, into inspection chamber 206 and places it on stage 24. After substrate 57 has been inspected, the reverse process takes place and substrate 57 is replaced in a cassette used to store substrates.

Alternately, a cassette of substrates could be loaded into the chamber in a similar way, each of the collection of substrates inspected and then the entire cassette of substrates removed and replaced with the next cassette of substrates.

Further still, the double lock arrangement of the present invention makes it possible to be inspecting one substrate in one chamber while simultaneously a second substrate is either being inserted and pressurized, or depressurized and removed, using the second chamber.

AUTOFOCUS SYSTEM

Electron beam 100 is focused by varying the current in the system's objective lens 104 (FIG. 4). Due to the fact that substrates are not always flat, and because the surface of stage 24 may not be perfectly perpendicular to the axis of column 20, the optimum focus current varies over the care area. Because this variation is slow as a function of distance in the x and y directions, it is feasible to determine the optimum focus current at a few designated points, and for any points in between these one may interpolate the desired focus current.

As part of the set-up and initialization of the inspection process, the system measures the optimum focus current at designated points. This focus calibration process consists of positioning the beam at the designated point and then measuring the gray scale value along a straight line perpendicular to an edge of a feature on substrate 57. The digitized gray scale values are then convolved with a high pass filter (not shown) for 10 differing values of focus current, for example. The best focus is then the current corresponding to the highest output from the high pass filter. In the preferred embodiment a second derivative filter is used with the following convolution coefficients as follows in this example:

| -4 | 0 | 0 | 0 | 8 | 0 | 0 | 0 | -4 |
|---|---|---|---|---|---|---|---|---|

For best results the output of the high pass filter should be smoothed.

The focus computer is part of column control computer 42. The focus computation is carried out in special purpose hardware consisting of a convolver integrated circuit and some DSP elements.

OPTICAL ALIGNMENT SYSTEM

Optical alignment system 22 is used by the operator to visually perform coarse alignment of the die after it enters the inspection chamber. The subsystem consists of a window into the vacuum chamber and lenses to project image patterns on a CCD camera for display on display 46. The operator can chose one of two lenses, (in the present invention these were empirically determined) one with a magnification of 0.46 and the other one with a magnification of 5.8 for the viewing of the pattern. In order to preclude the coating of optical surfaces with contamination from the substrate, all lenses are located outside the vacuum.

SEM PLASMA CLEANER

In the course of operation of the electron beam apparatus of the present invention, organic materials are deposited on various deflection and beam forming electrodes by proximity interaction (near surface charging of particles), and volatilization of target material then drawn to high tension regions. The resulting dielectric accumulations over time will, through surface charging, adversely affect beam steering and forming mechanisms. Necessary periodic removal of these materials is accomplished through employment of an oxidizing plasma formed in close proximity to those areas of accumulation.

Figure 8:
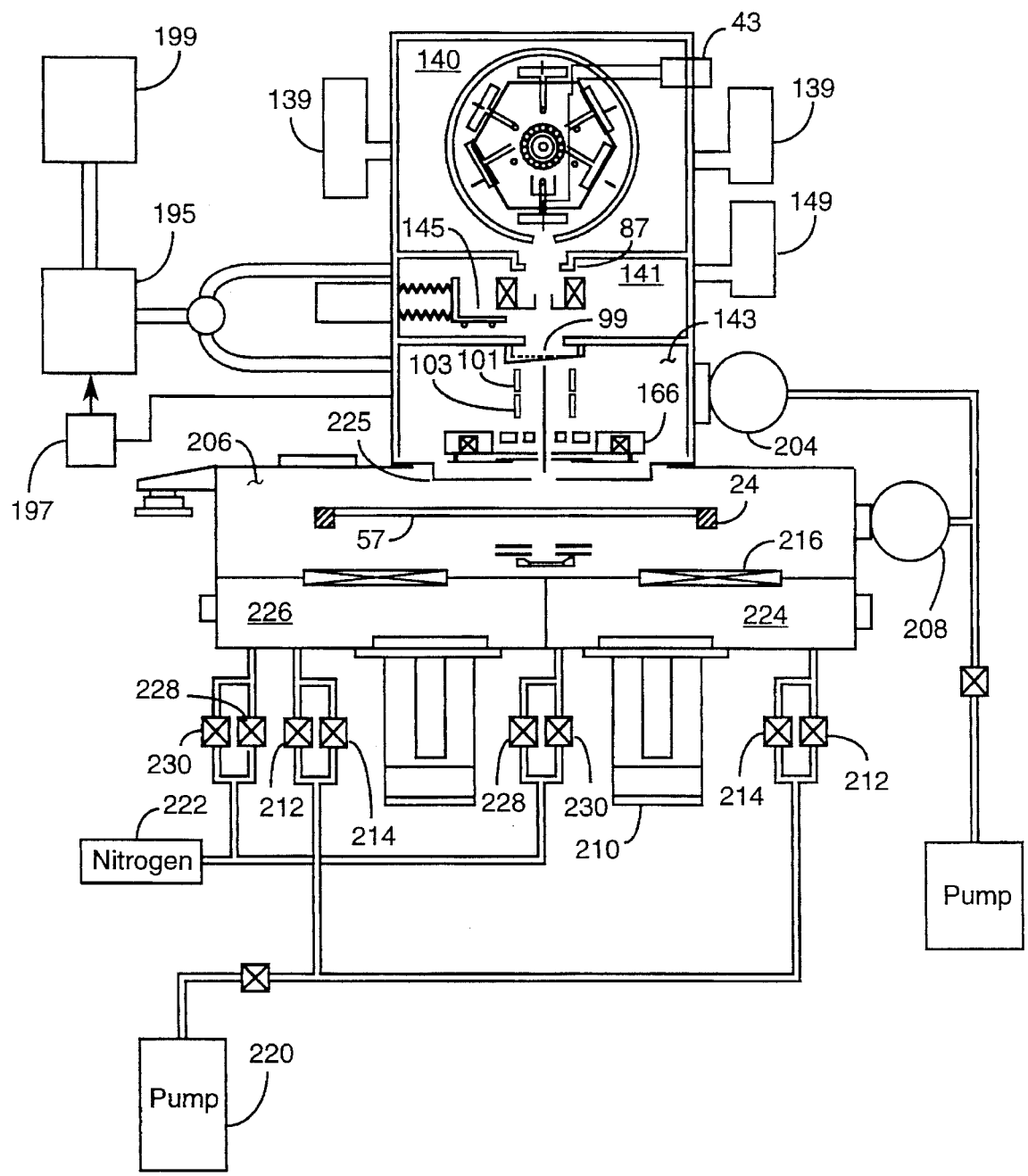
FIG. 8 is a schematic representation of the vacuum system of the present invention.

To perform that function, oxygen is used as the primary gas for the formation of a cleaning plasma. Referring to FIG. 8, oxygen supply 199 is introduced into the upper or lower portion of the chambers, 141 and 143, respectively, via valve 193 and regulated using a mass flow controller 195 to produce a controlled pressure sensed by capacitance manometer 197. Oxygen pressure is adjusted to optimize coupling of RF energy and localize the plasma excitation to each sequentially selected electrode, or other electrodes needed to clean other regions of the operating space, all having differing mean free paths for ionization. Oxidation of only the organics takes place by tightly controlling the spatial plasma density in discharge regions to a level just below the sputtering potential of the electrode surfaces. This is accomplished by suppression of electrode self biasing at high frequencies and precise RF power leveling, and/or voltage limiting.

Figure 12:
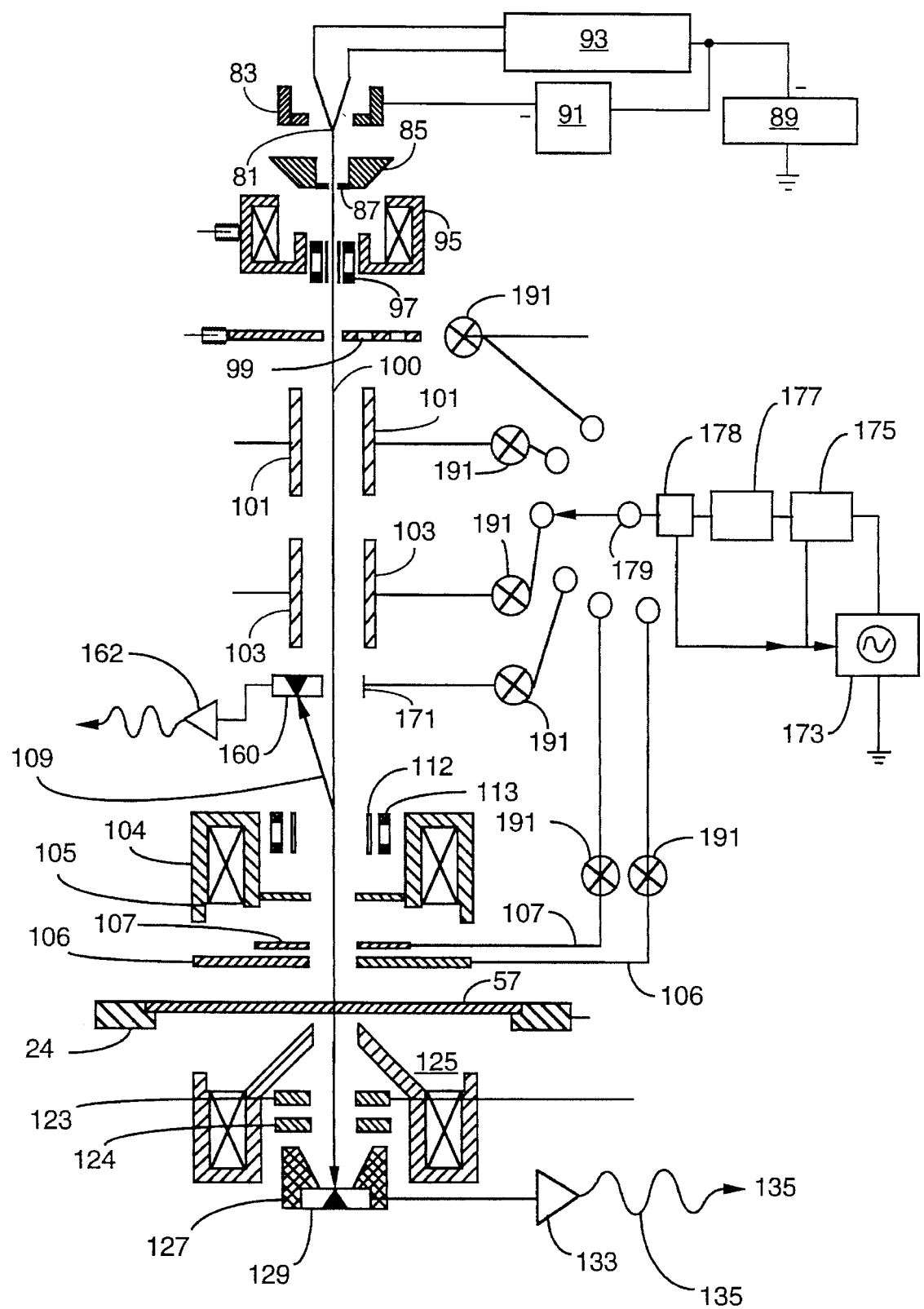
FIG. 12 is a modified schematic representation of the optical column of FIG. 4 to illustrate the electrical components of the plasma oxidizer subsystem of the present invention.

Referring now to FIG. 12, for electrodes requiring deposition removal or any other areas and or elements, all normal electrode path connections are switched through relays 191 to a radio frequency compatible multiplex relay 179 in order to direct RF energy sequentially to each. A generator of high frequency RF power 173 is enabled and then output leveled by power detector 175 and output voltage detector 178. Using an automatic match network 177 (such as an Automatch, registered trademark of RF Plasma Products, Cherry Hill N.J.), leveled RF output power is then transformed to appropriate voltage, current, and phase relation such as to provide both sufficient avalanche potential to initiate a plasma discharge as well as performing conjugate matching of the sustained discharge load.

Similarly the plasma may also clean any other surfaces or electrodes, such as 171.

While this invention has been described in several modes of operation and with exemplary routines and apparatus, it is contemplated that persons skilled in the art, upon reading the preceding descriptions and studying the drawings, will realize various alternative approaches to the implementation of the present invention. It is therefore intended that the following appended claims be interpreted as including all such alterations and modifications that fall within the true spirit and scope to the present invention and the appended claims.

What is claimed is:

1. An automatic system for the automatic inspection of a substantially non-conductive substrate comprising:
   a field emission electron source to provide an electron beam;
   a charged particle beam column to deliver and scan said electron beam from said field emission electron source on a surface of said substantially non-conductive substrate;
   at least one charged particle detector to detect at least one of three types of charged particles emanating from the top and bottom surfaces of said substantially non-conductive substrate, namely, secondary charged particles, back-scattered charged particles and transmitted charged particles;
   a continuously moving x-y stage disposed to receive said substantially non-conductive substrate and to provide at least one degree of motion to said substantially non-conductive substrate while the substantially non-conductive substrate is being scanned by the charged particle beam; and
   a multi-processor image defect computer coupled to said at least one charged particle detector to identify defects on said substrate.

2. An automatic system for the automatic inspection of a substrate as in claim 1 further comprising at least one electrode disposed to develop a substantially field free region at the surface of the substrate.

3. An automatic system for the automatic inspection of a substrate as in claim 1 further comprising a charged particle deflector to selectively direct said charged particles from the surface of said substrate to said charged particle detector.

4. An automatic system for the automatic inspection of a substrate as in claim 3 wherein said charged particle deflector produces crossed magnetic and electric deflection fields.

5. An automatic system for the automatic inspection of a substrate as in claim 3 wherein said charged particle optical column includes a Wien filter to deflect secondary charged particles from the surface of the substrate to said charged particle detector.

6. An automatic system for the automatic inspection of a substrate as in claim 1 wherein said system further comprises a comparator to compare a pattern on said substrate with a second pattern.

7. An automatic system for the automatic inspection of a substrate as in claim 1 further comprising an interferometer to determine the position of said x-y stage.

8. An automatic system for the automatic inspection of a substrate as in claim 1 further comprising a charged particle optical column, wherein said charged particle optical column has deflection elements to produce fields to control the path of charged particles, wherein said deflection elements include a Wien filter to deflect secondary charge particles from the surface of the substrate to said charged particle detector.

9. An automatic system for the automatic inspection of a substrate as in claim 1 further comprising a vacuum system including first and second chambers in each of which pressurization is performed independently to permit varying of the pressurization environment, and loading or unloading, of a first substrate in one of said first and second chambers while simultaneously inspecting a second substrate in a pressurized other one of said first and second chambers.

10. An automatic system for the automatic inspection of a substrate as in claim 9 wherein said vacuum system further includes two air locks to permit the independent variation of the pressure environment of each of said first and said second substrates while simultaneously inspecting a third substrate.

11. An automatic system for the automatic inspection of substrates as in claim 1 further comprising a vacuum system including a plurality of chambers in each of which pressurization is performed independently for simultaneously permitting the varying of the pressurization environment, loading, unloading or inspecting of up to the same plurality of substrates in a pipeline manner.

12. An automatic system for the automatic inspection of a substrate as in claim 1 wherein said charged particle beam column includes an objective lens having a retardation field to decelerate electrons in said electron beam.

13. An automatic system for the automatic inspection of a substrate as in claim 1 wherein the energy of said electron beam is between 500 and 1,500 volts.

14. An automatic system for the automatic inspection of a substrate as in claim 1 wherein said at least one charged particle detector only includes a charged particle detector to detect secondary electrons.

15. An automatic system for the automatic inspection of a substantially non-conductive substrate comprising:
   a charged particle optical column to selectively direct charged particles at a surface of said substrate; and
   a high speed semiconductor detector to detect at least one of the three types of charged particles emanating from the top and bottom surfaces of said substrate, namely, secondary charged particles, back-scattered charged particles and transmitted charged particles at a rate of at least 100 MHz.

16. An automatic system for the automatic inspection of a substantially non-conductive substrate comprising:
   a charged particle beam column to deliver and scan a charged particle beam on a surface of said substrate;
   a charged particle detector to detect at least one of the three types of charged particles emanating from the top and bottom surfaces of said substrate, namely, secondary charged particles, back-scattered charged particles and transmitted charged particles;
   an alignment system to align said substrate beneath said charged particle beam; and
   a multi-processor image defect computer coupled to said charged particle detector to identify defects on said substrate.

17. An automatic system for the automatic inspection of a substrate as in claim 16 wherein said system further comprises a comparator to compare a pattern on said substrate with a second pattern.

18. An automatic system for the automatic inspection of a substrate as in claim 16 wherein said alignment system automatically aligns the substrate beneath the charged particle beam.

19. An automatic system for the automatic inspection of a substrate as in claim 16 wherein said system further comprises a comparator to compare one pattern on said substrate with a second pattern on said substrate.

20. An automatic system for the automatic inspection of a substrate as in claim 16 wherein said alignment system performs automatically using an image pattern of the substrate being inspected for alignment of the substrate.

21. An automatic system for the automatic inspection of a substrate as in claim 16 wherein said alignment system includes an interferometer to automatically align the substrate being inspected.

22. An automatic system for the automatic inspection of a substrate as in claim 16 wherein:
   said systems further includes:
   a memory in which an image of the substrate to be inspected is pre-stored; and
   said alignment system in communication with said memory uses said stored image to automatically align the substrate being inspected.

23. An automatic system for the automatic inspection of a substrate as in claim 16 further comprising at least one electrode disposed to develop a substantially field free region at the surface of the substrate.

24. An automatic system for the automatic inspection of a substrate as in claim 16 further comprising a charged particle deflector to selectively direct particles from the surface of said substrate to said charged particle detector.

25. An automatic system for the automatic inspection of a substrate as in claim 16 further comprising a vacuum system including first and second chambers in each of which pressurization is performed independently to permit varying of the pressurization environment, and loading or unloading, of a first substrate in one of said first and second chambers while simultaneously inspecting a second substrate in a pressurized other one of said first and second chambers.

26. An automatic system for the automatic inspection of a substrate as in claim 25 wherein said vacuum system further includes two air locks to permit the independent variation of the pressure environment of each of siad first and said second substrates while simultaneously inspecting a third substrate.

27. An automatic system for the automatic inspection of a substrate as in claim 16 further comprising a vacuum system including a plurality of chambers in each of which pressurization is performed independently for simultaneously permitting the varying of the pressurization environment, loading, unloading or inspecting of up to the same plurality of substrates in a pipeline manner.

28. An automatic system for the automatic inspection of a substrate as in claim 16 wherein said charged particle beam column includes an objective lens having a retardation field to decelerate electrons in said electron beam.

29. An automatic system for the automatic inspection of a substrate as in claim 16 wherein the energy of said electron beam is between 500 and 1,500 volts.

30. An automatic system for the automatic inspection of a substrate as in claim 16 wherein said charged particle detector only detects secondary electrons.

31. A method for the automatic inspection of a substantially non-conductive substrate using an electron beam from a field emission source, said method comprising the steps of:
   a. positioning the electron beam on the substrate accurately by measuring the position of the substrate;
   b. deflecting the electron beam to the desired position of said substrate measured in step a.;
   c. scanning the desired position of a surface of the substrate with the electron beam as said substrate is continuously moving with at least one degree of motion in an x-y plane; and
   d. detecting at least one of the three types of charged particles emanating from the top and bottom surfaces of said substrate as a result of step c., namely, secondary charged particles, back-scattered charged particles and transmitted charged particles; and
   e. identifying defects on said substrate with a multi-processor image defect computer using information from step d.;
   wherein step a. includes computing misalignment of an image produced by step d. to control the positioning of said electron beam.

32. A method for the automatic inspection of a substrate as in claim 31 wherein said step a. is performed by detecting a pattern on said substrate for positioning.

33. A method for the automatic inspection of a substrate as in claim 31 wherein:
   said method further includes the step of:

e. prestoring the desired surface characteristics of said substrate in a memory means; and said step a. includes the step of:

f. comparing the surface characteristics of said substrate with the prestored characteristics of step e. to detect the position of said substrate.

34. A method for the automatic inspection of a substrate as in claim 31 wherein said step a. is performed by an interferometer.

35. A method as in claim 31 wherein step b. includes the step of retarding a field to decelerate electrons in said electron beam.

36. A method as in claim 31 wherein the energy of said electron beam is between 500 and 1,500 volts.

37. A method as in claim 31 wherein step d. only detects secondary electrons.

38. An automatic system for the automatic inspection of a substantially non-conductive substrate comprising:

a field emission electron source to provide an electron beam;

a charged particle beam column to deliver and scan said electron beam from said field emission electron source on a surface of said substrate;

a charged particle detector to detect at least one of the three types of charged particles emanating from the top and bottom surfaces of said substrate, namely, secondary charged particles, back-scattered charged particles and transmitted charged particles;

an interferometer to determine the position of said substrate with respect to said electron beam;

a stage disposed to receive said substrate and to provide continuous motion relative to said electron beam; and a multi-processor image defect computer coupled to said at least one charged particle detector to identify defects on said substrate.

39. An automatic system for the automatic inspection of a substrate as in claim 38 wherein said stage includes a continuously moving x-y stage disposed to receive said substrate and to provide at least one degree of motion to said substrate while the substrate is being scanned by the electron beam.

40. An automatic system for the automatic inspection of a substrate as in claim 38 wherein said charged particle beam column includes an objective lens having a retardation field to decelerate electrons in said electron beam.

41. An automatic system for the automatic inspection of a substrate as in claim 38 wherein the energy of said electron beam is between 500 and 1,500 volts.

42. An automatic system for the automatic inspection of a substrate as in claim 38 wherein said charged particle detector only detects secondary electrons.

43. An automatic system for the automatic inspection of a substantially non-conductive substrate using an electron beam, said system comprising:

a field emission source to provide an electron beam;

means for positioning the electron beam on the substrate accurately by measuring the position of the substrate;

means for deflecting the electron beam to the desired position of said substrate as measured by said positioning means;

means for scanning the desired position of a surface of the substrate with the electron beam;

a charged particle detector to detect at least one of the three types of charged particles emanating from the top and bottom surfaces of said substrate, namely, secondary charged particles, back-scattered charged particles and transmitted charged particles;

a continuously moving x-y stage disposed to receive said substrate and to provide at least one degree of motion to said substrate while the substrate is being scanned by the electron beam; and a multi-processor image defect computer responsive to said charged particle detector to identify defects on said substrate;

wherein said positioning means includes an alignment computer coupled to said charged particle detector and said x-y stage to determine misalignment of an image produced by said charged particle detector and said x-y stage, and to control the movement of said x-y stage.

44. An automatic system for the automatic inspection of a substrate as in claim 43 wherein said electron deflecting means includes an objective lens having a retardation field to decelerate electrons in said electron beam.

45. An automatic system for the automatic inspection of a substrate as in claim 43 wherein the energy of said electron beam is between 500 and 1,500 volts.

46. An automatic system for the automatic inspection of a substrate as in claim 43 wherein said charged particle detector only detects secondary electrons.

47. An electrostatic immersion objective lens for use within a charged particle beam column wherein said column delivers an electron beam from an electron source to a surface of a specimen through said electrostatic immersion objective lens that is spaced apart from said specimen, said electrostatic immersion objective lens comprising:

a first, a second, and a third electrode, said objective lens disposed to be positioned with said first electrode furthest from said specimen, said third electrode closest to said specimen, and said second electrode intermediate said first and third electrodes;

a first potential adjustment circuit connected between said first and third electrodes with said third electrode at a more negative potential that said first electrode; and a second potential adjustment circuit connected between said second electrode and one of said first and third electrodes to adjust the potential to create a substantially field free region at said surface of said specimen.

48. An electrostatic objective lens as in claim 47 further including a magnetic field generating subsystem to superimpose a magnetic field on said specimen.

49. A method for scanning an electron beam on the surface of a continuously moving specimen, said method to improve the image contrast, reduce image noise and minimize heating of said specimen, said method comprising the steps of:

a. scanning said electron beam on said specimen in a direction that is substantially perpendicular to the direction of instantaneous motion of said specimen;

b. deflecting said electron beam in the direction of the instantaneous motion of said specimen to scan the same area of said specimen several times;

c. detecting at least one of the three types of charged particles emanating from the top and bottom surfaces of said substrate as a result of step c., namely, secondary charged particles, back-scattered charged particles and transmitted charged particles;

d. identifying defects on said substrate using information from step c.; and e. repeating steps a. and b. as many times as desired.

50. A method as in claim 49 wherein step b. includes the step of retarding a field to decelerte electrons in said electron beam.

51. A method as in claim 49 wherein the energy of said electron beam is between 500 and 1,500 volts.

* * * * *